US008299419B2

(12) United States Patent
Vestergaard Hau

(10) Patent No.: US 8,299,419 B2
(45) Date of Patent: Oct. 30, 2012

(54) METHODS, SYSTEMS, AND APPARATUS FOR STORAGE, TRANSFER AND/OR CONTROL OF INFORMATION VIA MATTER WAVE DYNAMICS

(75) Inventor: Lene Vestergaard Hau, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 288 days.

(21) Appl. No.: 12/449,141

(22) PCT Filed: Jan. 25, 2008

(86) PCT No.: PCT/US2008/000988
§ 371 (c)(1),
(2), (4) Date: Sep. 11, 2009

(87) PCT Pub. No.: WO2008/147477
PCT Pub. Date: Dec. 4, 2008

(65) Prior Publication Data
US 2010/0012827 A1    Jan. 21, 2010

Related U.S. Application Data

(60) Provisional application No. 60/886,706, filed on Jan. 26, 2007, provisional application No. 60/887,878, filed on Feb. 2, 2007, provisional application No. 60/888,141, filed on Feb. 5, 2007, provisional application No. 60/895,249, filed on Mar. 16, 2007.

(51) Int. Cl.
*H01S 1/00*    (2006.01)
(52) U.S. Cl. ...................................... 250/251
(58) Field of Classification Search .................. 250/251
See application file for complete search history.

(56) References Cited

PUBLICATIONS

Dutton, Z. et al., "Storing and processing optical information with ultraslow light in Bose-Einstein condensates," Physical Review A, vol. 70, 2004, pp. 53831-1-53831-19.
Dutton, Z. et al., "The art of taming light: ultra-slow and stopped light," Europhysics News, Eur. Phys. Soc., Switzerland, 2004, vol. 35 No. 2, online version pp. 1-16 retrieved Sep. 26, 2008.
Ginsberg, N..S., et al. "Coherent control of optical information with matter wave dynamics," Nature Letters, Nature Publishing Group, vol. 445, No. 7128, Feb. 8, 2007, pp. 623-625.
International Search Report (partial), Application Serial No. PCT/US2008/000988, May 11, 2008.
Partial Transcript of Lene Hau's Talk at JILA Workshop, Feb. 1999.
Slides and Recording of Lene Hau's Talk at JILA Workshop, Feb. 1999, available at http://fermion.colorado.edu/~chg/Talks/Hau/.
Slides Displayed at Lene Hau's Talk at JILA Workshop, Feb. 1999.

*Primary Examiner* — Michael Maskell
*Assistant Examiner* — Hanway Chang
(74) *Attorney, Agent, or Firm* — Foley and Lardner LLP

(57) ABSTRACT

Methods, systems and apparatus for generating atomic traps, and for storing, controlling and transferring information between first and second spatially separated phase-coherent objects, or using a single phase-coherent object. For plural objects, both phase-coherent objects have a macroscopic occupation of a particular quantum state by identical bosons or identical BCS-paired fermions. The information may be optical information, and the phase-coherent object(s) may be Bose-Einstein condensates, superfluids, or superconductors. The information is stored in the first phase-coherent object at a first storage time and recovered from the second phase-coherent object, or the same first phase-coherent object, at a second revival time. In one example, an integrated silicon wafer-based optical buffer includes an electrolytic atom source to provide the phase-coherent object(s), a nanoscale atomic trap for the phase-coherent object(s), and semiconductor-based optical sources to cool the phase-coherent object(s) and provide coupling fields for storage and transfer of optical information.

46 Claims, 15 Drawing Sheets

METHODS, SYSTEMS, AND APPARATUS FOR STORAGE, TRANSFER AND/OR CONTROL OF INFORMATION VIA MATTER WAVE DYNAMICS

CROSS-REFERENCE TO RELATED APPLICATIONS

The present application claims priority to, and incorporates by reference the entirety of, the following U.S. Provisional Applications:

Ser. No. 60/888,141, filed Feb. 5, 2007, entitled "Methods and Apparatus for Control and Transfer of Information via Matter Wave Dynamics;"

Ser. No. 60/886,706, filed Jan. 26, 2007, entitled "Coherent Control of Optical Information with Matter Wave Dynamics;"

Ser. No. 60/887,878, filed Feb. 2, 2007, entitled "Methods and Apparatus for Control and Transfer of Information via Matter Wave Dynamics;" and Ser. No. 60/895,249, filed Mar. 16, 2007, entitled "Methods and Apparatus for Control and Transfer of Information via Matter Wave Dynamics."

GOVERNMENT SPONSORED RESEARCH

Some of the research relating to the subject matter disclosed herein was sponsored by the following United States government grants, and the United States government has certain rights to some disclosed subject matter: Air Force Office of Scientific Research (AFOSR), Grant #FA9550-05-1-0331; Air Force Office of Scientific Research (AFOSR)/Defense University Research Instrumentation Program (DURIP), Grant #FA9550-05-1-0333 and Grant #FA9550-07-1-0252; National Science Foundation (NSF), Grant #PHY-0456881; National Aeronautics and Space Administration (NASA), Grant #NAG3-2909.

FIELD OF THE DISCLOSURE

The present disclosure relates to inventive methods, systems and apparatus for generating atomic traps, and sculpting of atomic matter waves with coherent light, including storage, transfer, and/or control of information, such as optical information, via matter wave dynamics.

BACKGROUND

The behavior of atoms at very low temperatures approaching absolute zero (−273.15 degrees Celsius, or 0 degrees Kelvin) results in extraordinary physical phenomena. In a system of many identical atoms at absolute zero temperature, the atoms occupy the lowest possible energy state compatible with their spin. The associated quantum statistics for elementary and composite particles relating to atoms significantly govern their behavior at very low temperatures.

All elementary particles (a particle not known to be made up of smaller particles) and composite particles are categorized into two classes, respectively referred to as "bosons" and "fermions." Bosons and fermions are differentiated by their "spin" (the spin of a particle is its intrinsic angular momentum, and is either an integer or half-integer value, in multiples of Planck's constant); specifically, bosons have integer spin, and fermions have half-integer spin. According to the quantum mechanics "spin-statistics theorem," which relates the spin of a particle to the statistics obeyed by that particle, only one fermion can occupy a given quantum state (the "Pauli exclusion principle"), while the number of bosons that can occupy a given quantum state is not restricted. Furthermore, bosons cause stimulated scattering of identical bosons into the same quantum state.

The basic building blocks of matter such as protons, neutrons and electrons are fermions, whereas particles such as photons and phonons, which mediate forces between matter particles, are bosons (the ability of multiple phonons to occupy a given quantum state is the principle by which a laser operates). Particles composed of a number of other particles can be either fermions or bosons, depending on their total spin. Hence, even though protons, neutrons and electrons are all fermions, it is possible for a single element (e.g., helium or He) to have some isotopes that are fermions (e.g. $^3$He) and other isotopes that are bosons (e.g. $^4$He). Sodium-23 is another example of a boson isotope. Many nuclei also are bosons; for example, the deuterium atom (an isotope of hydrogen) composed of three fermions (proton+neutron+electron) is a fermion, while its nucleus [NP] when separated from the electron is a boson. Accordingly, any nucleus with an integer spin likewise is a boson.

A Bose-Einstein condensate is a phase-coherent state of matter formed when a large number of identical bosons occupy the same quantum state. This occurs, for example, when a system of identical bosons are cooled to temperatures very near to absolute zero. Under such supercooled conditions, a large fraction of the bosons occupy the lowest quantum state (i.e., ground state). At this point, quantum effects become apparent on a macroscopic scale.

The formation of Bose-Einstein condensates is also responsible for the superfluid behavior of certain fluids. These "superfluids" are characterized by the complete absence of viscosity and quantized vorticity. Superfluidity was originally discovered in liquid helium-4 ($^4$He); the primary difference between superfluid helium and a Bose-Einstein condensate is that the former is condensed from a liquid while the latter is condensed from a gas.

Fermionic superfluids are known as well, but because fermions are prohibited from occupying the same quantum state, fermionic superfluids generally are harder to produce. Both fermionic superfluids (e.g., $^3$He and cooled fermionic alkali gases such as $^6$Li and $^{40}$K) and "superconductors" (materials that when cooled to sufficiently low temperatures are characterized by exactly zero electrical resistance) may be described by the "BCS" theory (Bardeen, Cooper, and Schrieffer), which attributes the superconducting state and, by implication, the superfluid state of a fermionic fluid, to the formation of a Bose-Einstein condensate of "Cooper pairs." In superconductors, Cooper pairs consist of two electrons that interact (are attracted to each other) through the exchange of phonons, and the electron pairs flow without energy dissipation. For the fermionic superfluids like $^3$He, the Cooper pairs consist of two fermionic helium atoms. In this manner, the behavior of the Cooper pairs may be viewed as similar to that of bosons. Under certain conditions, fermion pairs can also form diatomic molecules and undergo Bose-Einstein condensation.

In recent years, significant progress has been achieved in manipulating matter with light, and light with matter. Resonant laser fields interacting with cold, dense atom clouds provide a particularly rich system. Such light fields interact strongly with the internal electrons of the atoms, and couple directly to external atomic motion through recoil momenta imparted when photons are absorbed and emitted. Ultraslow light propagation in Bose-Einstein condensates represents an extreme example of resonant light manipulation using cold atoms. In particular, it has been shown that information relating to the phase and amplitude of an optical pulse incident on a Bose-Einstein condensate may be "stored" in the condensate in the form of an imprint on the external wavefunction components that correspond to condensate atoms in particular internal energy states. Subsequently, an optical pulse may be "revived" or regenerated from the condensate, based on the stored information relating to the incident optical pulse.

SUMMARY

The present disclosure is directed generally to inventive methods, systems and apparatus for generating atomic traps, and sculpting of atomic matter waves with coherent light, including storage, transfer, and/or control of information, such as optical information, via matter wave dynamics. In exemplary inventive embodiments described herein, information is either transferred over some distance between two separate "phase-coherent objects," or propagated from one phase-coherent object, processed or manipulated, and returned to the phase-coherent object for storage.

For purposes of the present disclosure, a "phase-coherent object" refers to a state of matter in which there is a macroscopic occupation by identical bosons, including identical BCS-paired fermions (e.g., Cooper electron pairs), of a particular quantum state. In another aspect, the internal structure of the bosons of a phase-coherent object includes a three-level system having two quantum states (e.g., first and second quantum states) that are relatively stable and can couple to a common third quantum state. In yet other aspects, the first state does not need to be ground state, and the second state does not need to be above the first state. In yet another aspect, a phase-coherent object includes a system with a number N of atoms, where N is larger than or equal to one, and wherein all N atoms occupy the same quantum state. In yet another aspect, to store some number n of photons, N must be larger than n, and for the case of two phase-coherent objects, N must be equal to or larger than n.

Two phase-coherent objects between which information is transferred both have a macroscopic occupation of a particular quantum state by identical types of particles. Accordingly, it should be appreciated that examples of phase-coherent objects contemplated by the present disclosure include Bose-Einstein condensates, bosonic and fermionic superfluids, and superconductors.

With respect to information storage, transfer and/or control, in one embodiment, a first optical pulse is stopped in a first phase-coherent object, and phase and amplitude information relating to the first optical pulse is "stored" in the first phase-coherent object. A second optical pulse subsequently is revived in a second phase-coherent object that is spatially separated from the first phase-coherent object, based on the information relating to the first optical pulse that is stored in the first phase-coherent object. In one aspect, the information is transferred between the first and second phase-coherent objects via a travelling matter wave.

More specifically, in the presence of an optical coupling field, the first optical pulse is injected into the first phase-coherent object, where it is spatially compressed to a length much shorter than the coherent extent of the object. The coupling field is then turned off, leaving the atoms in the first phase-coherent object in quantum superposition states that comprise a stationary component and a recoiling component in a different internal state. The amplitude and phase of the spatially localized first optical pulse are imprinted on the recoiling part of the first object's wavefunction, which serves as a "messenger" atom matter wave pulse that moves towards the second phase-coherent object. When this messenger atom wave pulse is embedded in the second phase-coherent object, the system is re-illuminated with the coupling laser. The messenger atom wave pulse is coherently added to the matter field of the second object by way of slow-light-mediated atomic matter-wave amplification, and by virtue of the coupling laser a second optical pulse is thusly generated from the second phase-coherent object. The second or "revived" optical pulse records the relative amplitude and phase between the recoiling atomic imprint due to the first optical pulse and the second phase-coherent object.

In yet another embodiment, using a single phase-coherent object, in the presence of an optical coupling field, a first optical pulse is injected into the phase-coherent object, where it is spatially compressed to a length much shorter than the coherent extent of the object. The coupling field is then turned off, leaving the atoms in the phase-coherent object in quantum superposition states that comprise a stationary component and a recoiling component in a different internal state. The amplitude and phase of the spatially localized first optical pulse are imprinted on the recoiling part of the object's wavefunction, which moves out of the phase-coherent object as a "matter imprint" or "messenger atom wave pulse." While this matter imprint is outside of the phase-coherent object (e.g., in free space), it can be held, or manipulated (e.g., processed) and then sent back to the object. When it arrives back to the phase-coherent object, the object is re-illuminated with the coupling laser. The returned messenger atom wave pulse is coherently added to the matter field of the phase-coherent object by way of slow-light-mediated atomic matter-wave amplification, and by virtue of the coupling laser a second optical pulse is thusly generated from the phase-coherent object. The second or "revived" optical pulse records the relative amplitude and phase between the recoiling atomic imprint (due to the first optical pulse) and its return to the phase-coherent object.

In some embodiments, trapping and cooling of the phase-coherent object(s) may be accomplished via an electro-optical technique employing nanoscale structures (structures having dimensions on the scale of nanometers, e.g., nanowires, nanocylinders, nanospheres, etc.). In particular, electro-optical atomic trapping methods and apparatus according to various embodiments of the present invention exploit the combination of an attractive potential of a static electric field generated by nanostructures, and a repulsive potential of an appropriately tuned optical (laser) field, to trap and cool atoms. In one aspect of this embodiment, the nanostructures are particularly configured to facilitate surface plasmon-enhanced laser field gradients proximate to the nanostructures, and in turn these plasmon-enhanced laser field gradients provide a viscous damping force that significantly facilitates loading and stabilizing of the trap.

In yet other embodiments, inventive electro-optical atomic trapping methods and apparatus according to the present disclosure, based on nanoscale structures, facilitate integrated (e.g., silicon wafer-based) realizations of inventive methods and systems for storing, transferring, and controlling optical information via one or more phase-coherent objects. For example, in one inventive embodiment disclosed herein, an integrated silicon wafer-based optical buffer is realized based on optical information storage and recovery in one or more phase-coherent objects. In various aspects, the integrated optical buffer includes an electrolytic atom source to provide the phase-coherent object(s), and a nanoscale electro-optical atomic trapping apparatus to trap and cool the phase-coherent object(s). The integrated optical buffer also includes at least one semiconductor-based optical source as part of the electro-optical atomic trapping apparatus to provide optical trapping and damping fields, as well as at least one other semiconductor-based optical source to provide coupling fields for storage and transfer of optical information.

In sum, one embodiment of the present disclosure is directed to a method, comprising transferring information between first and second spatially separated phase-coherent objects, wherein both phase-coherent objects have a macroscopic occupation of a particular quantum state by identical bosons or identical BCS-paired fermions.

In various aspects of this embodiment, the information may be optical information, and the phase-coherent objects may be Bose-Einstein condensates, superfluids, or superconductors. In another aspect, the phase-coherent objects are spatially separated by a distance approximately equal to or greater than at least one dimension of one of the phase-coherent objects.

In yet other aspects of this embodiment, the method may further comprise storing the information in the first phase-coherent object at a first storage time, and recovering the information from the second phase-coherent object at a second revival time. Furthermore, the method may comprise controlling the second revival time so as to process the information recovered from the second phase-coherent object, and/or manipulating the information as it is transferred between the first and second phase-coherent objects.

Another embodiment is directed to a method of transferring optical information between first and second spatially separated atomically identical Bose-Einstein condensates. The method comprises: A) irradiating the first Bose-Einstein condensate with an optical beam resonant or near-resonant with a first transition between a second energy state and the third energy state of bosons of the Bose-Einstein condensates; B) irradiating the first Bose-Einstein condensate with a first optical pulse resonant or near-resonant with a second transition between a first energy state and a third energy state of the bosons of the Bose-Einstein condensates, the first optical pulse propagating counter to a propagation direction of the optical beam, wherein the transferred optical information relates at least in part to a phase and amplitude of the first optical pulse; C) extinguishing the optical beam at a first storage time at which the first optical pulse is contained completely within the first Bose-Einstein condensate, so as to eject from the first Bose-Einstein condensate a coherent matter wave pulse carrying the optical information from the first optical pulse; D) injecting the second Bose-Einstein condensate with the coherent matter wave pulse; and E) irradiating the second Bose-Einstein condensate with the optical beam at a second revival time at which the coherent matter wave pulse is embedded in the second Bose-Einstein condensate so as to generate a second optical pulse from the second Bose-Einstein condensate based on the optical information carried by the coherent matter wave pulse.

Another embodiment is directed to a system for transferring optical information. The system comprises a first phase-coherent object to receive a first optical pulse resonant or near-resonant with a first transition between a first energy state and a third energy state of bosons or BCS-paired fermions of the first phase-coherent object. The system further comprises a radiation source configured to generate an optical beam that irradiates at least the first phase-coherent object in a direction that is counter-propagating to or orthogonal to the first optical pulse, the optical beam being resonant or near-resonant with a second transition between a second energy state and the third energy state of the bosons or the BCS-paired fermions of the first phase-coherent object. The system further comprises a second phase-coherent object spatially separated from the first phase-coherent object, wherein the first and second phase-coherent objects have a macroscopic occupation of a particular quantum state by identical bosons or identical BCS-paired fermions, and a controller configured to control at least the radiation source to turn on and off the optical beam so as to transfer the optical information from the first phase-coherent object to the second phase-coherent object via a coherent matter wave pulse, wherein the transferred optical information relates at least in part to a phase and amplitude of the first optical pulse.

Another embodiment is directed to a method, comprising: A) storing information in a phase-coherent object at a first storage time; B) ejecting from the phase-coherent object a coherent matter wave pulse carrying the information; C) returning the coherent matter wave pulse to the phase-coherent object; and D) recovering the information from the first phase-coherent object at a second revival time.

Another embodiment is directed to a method of processing optical information using a Bose-Einstein condensate, the method comprising: A) irradiating the Bose-Einstein condensate with an optical beam resonant or near-resonant with a first transition between a second energy state and the third energy state of bosons of the Bose-Einstein condensate; B) irradiating the Bose-Einstein condensate with a first optical pulse resonant or near-resonant with a second transition between a first energy state and a third energy state of the bosons of the Bose-Einstein condensate, the first optical pulse propagating counter to a propagation direction of the optical beam, wherein the optical information relates at least in part to a phase and amplitude of the first optical pulse; C) extinguishing the optical beam at a first storage time at which the first optical pulse is contained completely within the Bose-Einstein condensate, so as to eject from the Bose-Einstein condensate a coherent matter wave pulse carrying the optical information from the first optical pulse; D) returning the coherent matter wave pulse to the Bose-Einstein condensate; and E) irradiating the Bose-Einstein condensate with the optical beam at a second revival time at which the coherent matter wave pulse is embedded in the Bose-Einstein condensate so as to generate a second optical pulse from the Bose-Einstein condensate based on the optical information carried by the coherent matter wave pulse.

Another embodiment is directed to an system for processing optical information. The system comprises: a phase-coherent object to receive a first optical pulse resonant or near-resonant with a first transition between a first energy state and a third energy state of bosons or BCS-paired fermions of the phase-coherent object; a radiation source configured to generate an optical beam that irradiates the phase-coherent object in a direction that is counter-propagating to or orthogonal to the first optical pulse, the optical beam being resonant or near-resonant with a second transition between a second energy state and the third energy state of bosons or BCS-paired fermions of the phase-coherent object; a controller configured to control at least the radiation source to turn on and off the optical beam so as to transfer the optical information from the phase-coherent object to a coherent matter wave pulse that propagates outside of the phase-coherent object, wherein the transferred optical information relates at least in part to a phase and amplitude of the first optical pulse; and at least one processor to process the optical information in the coherent matter wave pulse. Upon return of the coherent matter wave pulse to the phase-coherent object, the controller is further configured to control the radiation source to turn on and off the optical beam so as to generate from the phase-coherent object a second optical pulse based on the processed optical information.

Another embodiment is directed to an apparatus, comprising a support structure, and a well, trench or aperture formed at least partially through at least a portion of the support structure so as to provide a gap on at least one surface of the support structure. The apparatus further comprises at least one nanoscale wire coupled to the support structure and disposed across the gap, and at least one nanostructure formed on the at least one nanoscale wire.

Another embodiment is directed to an optical buffer apparatus, comprising an electrolytic atom source to generate a stream of atoms, and at least one electro-optical atomic trapping apparatus to provide at least one trapping region to trap and cool at least some atoms of the stream of atoms so as to form at least one phase-coherent object. In one aspect, the electro-optical atomic trapping apparatus comprises at least one nanoscale wire, and at least one three-dimensional nanostructure formed on the at least one nanoscale wire so as to generate an electrostatic potential proximate to the at least one three-dimensional nanostructure when a voltage is applied to the at least one nanoscale wire. The trapping apparatus further comprises a first semiconductor optical source that, when energized, provides a first optical field that generates an optical potential proximate to the at least one three-dimensional nanostructure, wherein a combination of the optical potential and the electrostatic potential forms the at least one trapping region. The optical buffer apparatus may further comprise at least one second semiconductor optical source that, when energized, provides an optical coupling field in the at least one trapping region to facilitate storage of optical information in the at least one phase-coherent object.

The concepts disclosed herein provide a dramatic demonstration of manipulation of matter on a scale of nanometers (e.g., atomic trapping), and coherent optical information processing with matter wave dynamics. Such quantum control facilitates application including, but not limited to, optical buffering and optical memory, quantum information processing and wavefunction sculpting.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference or otherwise referred to herein should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of inventive embodiments disclosed herein.

DETAILED DESCRIPTION

Following below are more detailed descriptions of various concepts related to, and embodiments of, inventive methods, systems, and apparatus according to the present disclosure for storage, transfer and/or control of information via matter wave dynamics, as well as generation of atomic traps. It should be appreciated that various aspects of the subject matter introduced above and discussed in greater detail below may be implemented in any of numerous ways, as the subject matter is not limited to any particular manner of implementation. Examples of specific implementations and applications are provided primarily for illustrative purposes. In particular, it should be appreciated that while a specific example involving Bose-Einstein condensates of bosons is discussed in detail below, the concepts disclosed herein apply more generally to systems involving both bosons (including bosonic superfluids) as well as systems involving BCS-paired fermions (e.g., fermionic superfluids and superconductors).

Figure 1:
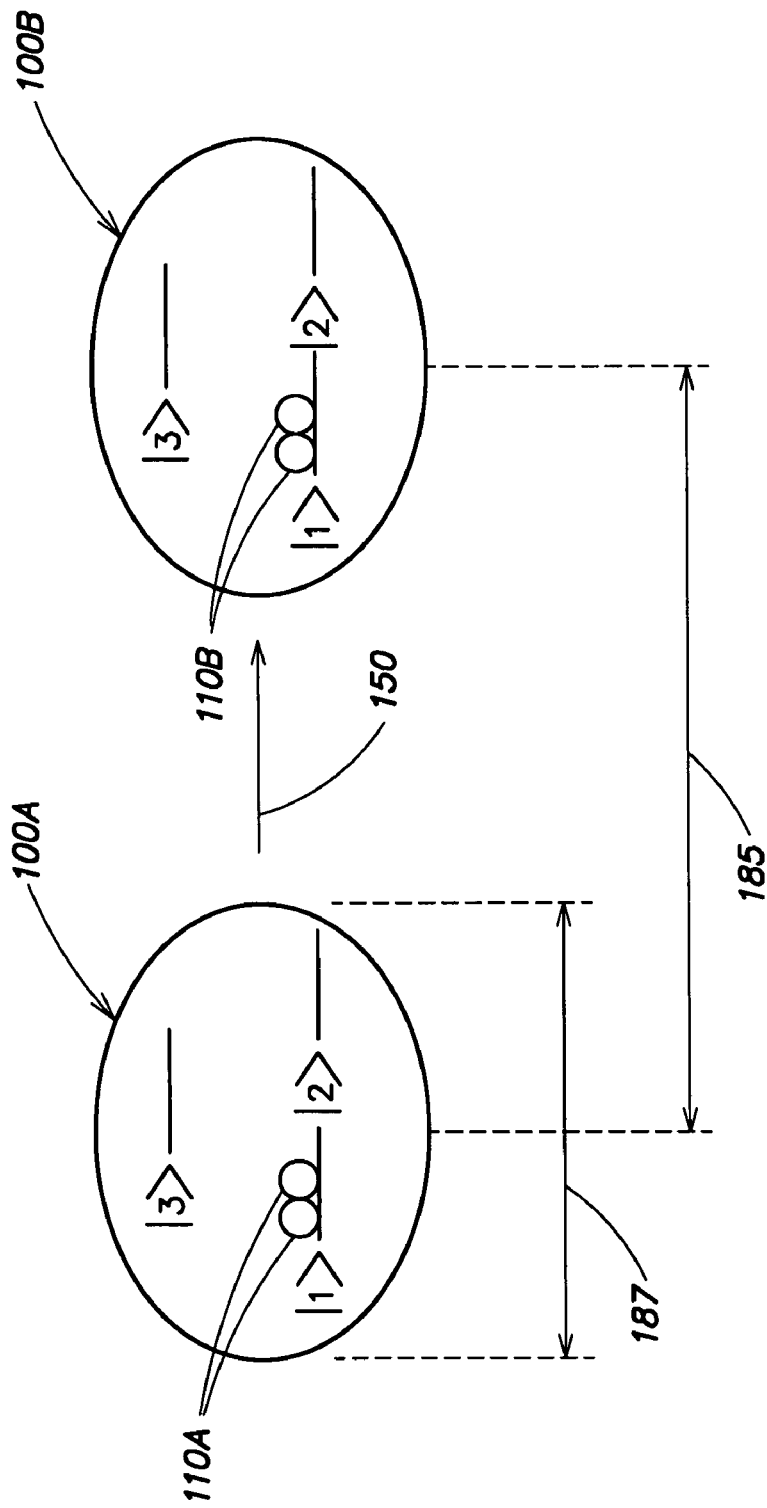
FIG. 1 illustrates some general concepts underlying a method for transferring information between two phase-coherent objects, according to one embodiment of the present invention.

FIG. 1 illustrates some general concepts underlying a method for storing and transferring information between two phase-coherent objects, according to one embodiment of the present invention. In FIG. 1, information 150 is transferred between a first phase-coherent object 100A and a second phase-coherent object 100B. In one aspect, both phase-coherent objects 100A and 100B have a macroscopic occupation of a particular quantum state (e.g., quantum energy state |1>) by identical bosons or identical BCS-paired fermions 110A, 110B.

As discussed above, for purposes of the present disclosure, a "phase-coherent object" refers to a state of matter in which there is a macroscopic occupation by identical bosons, including identical BCS-paired fermions (e.g., Cooper electron pairs), of a particular quantum energy state. The internal structure of the bosons of the phase-coherent object includes a three-level system having two quantum energy states (e.g., first and second quantum states) that are relatively stable and can couple to a common third quantum energy state. In should be appreciated, however, that the first state is not required to be a ground state, and the second state is not required to be above the first state.

Figure 4:
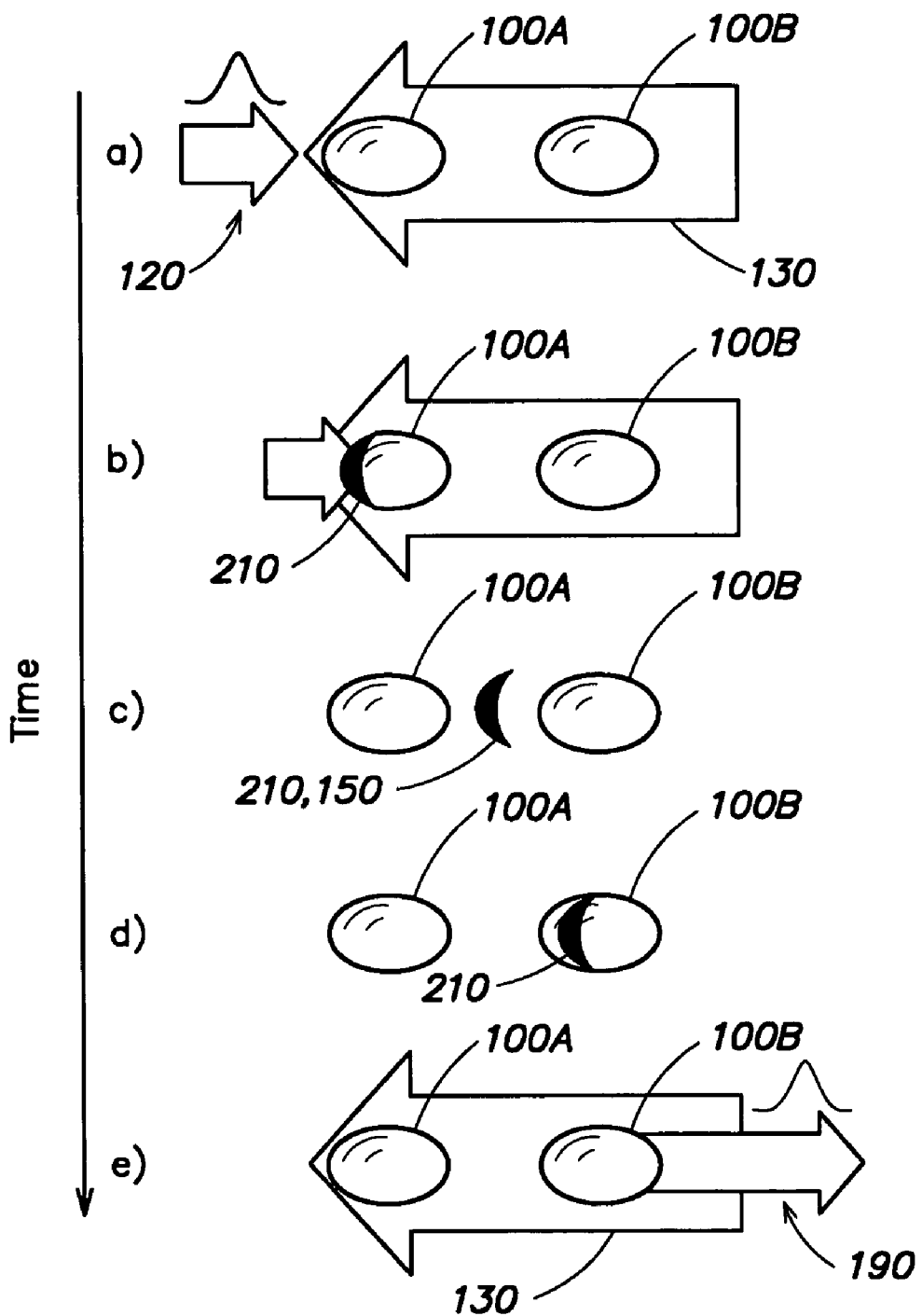
FIGS. 4*a* through 4*e* provide an elapsed time illustration of information transfer between two phase-coherent objects in the method of FIG. 1 and the system of FIG. 2, according to one embodiment of the present invention.

In various aspects of the embodiment of FIG. 1, as discussed in greater detail below, the information 150 transferred between the first and second phase-coherent objects 100A and 100B may be optical information, and the phase-coherent objects 100A and 100B may be Bose-Einstein condensates, superfluids, or superconductors. In another aspect, the phase-coherent objects are spatially separated by a distance 185 approximately equal to or greater than the spatial extent of a coherent matter wave pulse propagating between the objects, as discussed further below in connection with FIG. 4. In yet another aspect, the phase-coherent objects are spatially separated by a distance approximately equal to or greater the ant least one dimension of one of the phase-coherent objects (e.g., the dimension 187). In various embodiments discussed further below, exemplary non-limiting values for the distance 185 may be on the order of from approximately 100 micrometers to 200 micrometers.

Figure 2:
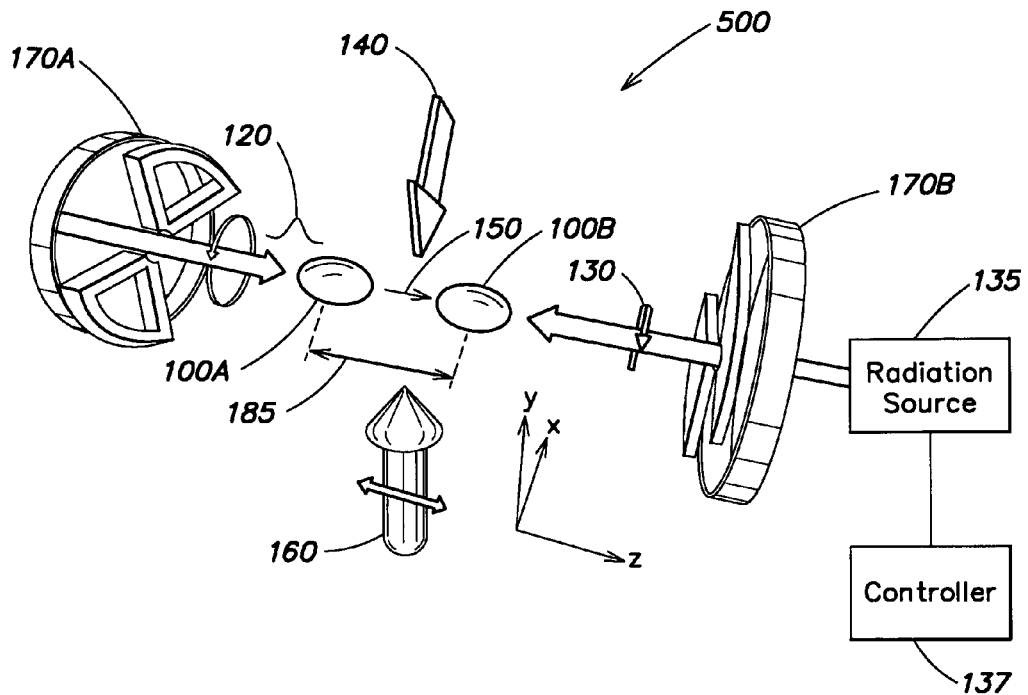
FIG. 2 illustrates a system for transferring information between two phase-coherent objects, according to one embodiment of the present invention.

FIG. 2 illustrates additional details of a system 500 for transferring the information 150 between the two phase-coherent objects 100A and 100B shown in FIG. 1, according to one embodiment of the present invention. In one aspect, the system 500 includes elements to facilitate trapping and cooling of the phase-coherent objects. In general, trapping and cooling of the phase-coherent objects involves creating an attractive magnetic or electric potential which is balanced by a repulsive potential provided by an optical field. In the exemplary implementation illustrated in FIG. 2, an electro-magnetic trapping technique is employed in which magnetic trapping coils 170A and 170B are used together with an optical trapping field 140 to create a "double-well" potential in which the phase-coherent objects are trapped and cooled. In another embodiment of the system 500 discussed further below in connection with FIGS. 9-14, trapping and cooling of the phase-coherent objects 100A and 100B may be accomplished via an electro-optical technique employing nanoscale structures (structures having dimensions on the scale of nanometers, e.g., nanowires and nanospheres) to create attractive potentials from static electric fields, which are balanced by a repulsive optical potential.

Figure 3:
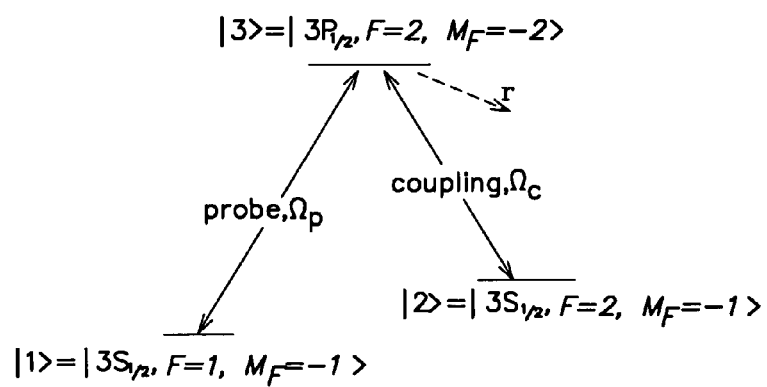
FIG. 3 is a diagram illustrating an example of appropriate quantum energy states to facilitate information transfer between two phase-coherent objects, according to one embodiment of the present invention.

In one aspect, the system 500 of FIG. 2 is configured generally to store, transfer, and/or process information associated with an input optical pulse. In particular, as shown in FIG. 2, the first phase-coherent object 100A receives a first optical pulse 120 (also referred to herein as a "probe" pulse) resonant or near-resonant with a first transition between a first energy state and a third energy state of the bosons (or BCS-paired fermions) of the first phase-coherent object. A radiation source 135 of the system 500 is configured to generate an optical beam 130 (also referred to herein as a "coupling beam") that irradiates at least the first phase-coherent object 100A in a direction that is counter-propagating to or orthogonal to the first optical pulse 120. The optical beam 130 is resonant or near-resonant with a second transition between a second energy state and the third energy state of the bosons (or the BCS-paired fermions) of the first phase-coherent object 100A. FIG. 3 is a diagram illustrating an example of appropriate quantum energy states to facilitate information transfer between two phase-coherent objects, and transitions between energy states associated with the first optical pulse 120 ("probe") and the optical beam 130 ("coupling"), according to one embodiment of the present invention.

In the system of FIG. 2, a controller 137 controls the radiation source 135 to turn on and off the optical coupling beam 130, according to a particular protocol as discussed further below in connection with FIGS. 4a through 4e, so as to transfer the information 150 from the first phase-coherent object 100A to the second phase-coherent object 100B via a coherent matter wave pulse, wherein the transferred information relates at least in part to a phase and amplitude of the first optical pulse 120. Once the information is transferred via the coherent matter wave pulse, the controller 137 again controls the radiation source 135 to turn on and off the optical coupling beam 130 so as to generate from the second phase-coherent object 100B a second optical pulse, based on the information transferred by the coherent matter wave pulse and relating to the first optical pulse.

FIGS. 4a through 4e provide an elapsed time illustration of information transfer between the two phase-coherent objects in the method of FIG. 1 and the system of FIG. 2, according to one embodiment of the present invention. In FIG. 4a, as discussed above, at least the first phase-coherent object 100A is irradiated with the optical coupling beam 130, and the first optical pulse 120 is injected into the first phase-coherent object 100A. As the propagating pulse 120 enters the first phase-coherent object, as shown in FIG. 4b, it creates a slight atomic polarization in the first phase-coherent object 100A that slows and spatially compresses the pulse until the pulse is contained entirely within the first phase-coherent object. The variation of the probe pulse in space and time is imprinted on one of the quantum wavefunctions of the bosons of the first phase-coherent object, thereby constituting a coherent "matter wave" pulse 210 that accompanies the highly compressed, slowly moving first optical pulse 120 through the condensate.

Once the optical pulse 120 is contained completely within the first phase-coherent object 100A, the controller 137 of FIG. 2 controls the radiation source 135 so as to turn off the optical coupling beam 130. In turn, the bosons of the first phase-coherent object drive the first optical probe pulse to extinction; however, an imprint of the phase and amplitude of the first optical probe pulse 120 remains in the coherent matter wave pulse 210. In this manner, the coherent matter wave pulse 210 serves as a carrier for information 150 (e.g., phase and amplitude) associated with the first optical pulse 120. As shown in FIGS. 4c and 4d, the coherent matter wave pulse 210 carrying the information 150 is ejected from the phase-coherent object in the same direction as the incident optical probe pulse 120, and travels towards and into the second phase-coherent object 100B.

Although the coherent matter wave pulse 210 is foreign to the second phase-coherent object 100B, once embedded in the second phase-coherent object it may be coherently added to one of the quantum wavefunctions of the bosons of the second phase-coherent object. This happens when, as shown in FIG. 4e, the controller 137 controls the radiation source 135 to turn on the optical coupling beam 130 so as to irradiate at least the second phase-coherent object 110B. In the presence of the coupling beam 130, the bosons of the second phase-coherent object 110B cooperate to generate a second optical pulse 190, which propagates out of the second phase-coherent object. This second optical pulse 190 is qualitatively similar to the first optical probe pulse 120, and records the relative phase and amplitude between the coherent matter wave pulse 210 originating in the first phase-coherent object (once the coupling beam is extinguished, i.e., prior to the time corresponding to FIG. 4c), and propagating into the second phase-coherent object up to the time of irradiation of the second phase-coherent object by the re-energized optical coupling beam 130.

In one exemplary implementation of the system 500 shown in FIG. 2, the phase-coherent objects 100A and 100B may be Bose-Einstein condensates (BECs) of approximately $1.8 \times 10^6$ sodium-23 ($^{23}$Na) atoms each, wherein the BECs are separated by a distance (e.g., approximate center-to-center distance) 185 of more than 100 micrometers and created in a double-well trapping potential in internal energy state |1>. In one aspect, a 2.3-μK-deep double-well potential is formed by combining a harmonic magnetic trap provided by the magnetic trapping coils 170A and 170B, and a repulsive optical dipole barrier generated by the optical trapping field 140 (e.g., a focused 532 nm green laser beam 140 with elliptical Gaussian cross-section, blue-detuned from the atomic resonance of the BECs). The atoms are evaporatively cooled in the double-well potential (the Bose-condensation temperature is 660 nanoKelvin). After condensation, the magnetic potential is adiabatically softened to $\omega_z = 2\pi \times 20$ Hz and $\omega_r = 2\pi \times 40$ Hz. Subsequently, the repulsive optical dipole barrier is adiabatically lowered to 10μ, where μ is each well's resulting chemical potential. The trapping potential is then turned off in less than 200 microseconds.

In this exemplary implementation of the system 500 of FIG. 2, once the trapping potential is turned off, and after approximately 1 millisecond, the BECs are illuminated with the optical coupling beam 130, which is a laser beam resonant with the BECs' internal |2>→|3> quantum energy state transition and travelling in the –z direction (refer to the coordinate system axis shown in FIG. 2). A counter-propagating, three microsecond Gaussian 'probe' laser pulse 120, resonant with the BECs' internal |1>→|3> quantum energy state transition, is then injected into the first BEC 100A. The input optical pulse 120 and the coupling beam 130 drive the sodium atoms (bosons) of the BECs into coherent superposition "dark" states with destructively interfering absorption amplitudes, such that neither the probe pulse 120 nor the coupling beam 130 is absorbed. The propagating probe pulse 120 creates a slight atomic polarization in the first BEC 100A that slows and spatially compresses the pulse by a factor of approximately $5 \times 10^7$. Ultimately, the probe pulse 120 is completely contained within the first BEC 100A. As also shown in FIG. 2, in another aspect, the BECs 100A and 100B may be imaged with an imaging laser beam 160, near resonance for the F=2→F=3 transition of the bosons of the BECs, after optical pumping to F=2.

The general theory underlying the concepts and processes discussed above in connection with FIGS. 1 through 4 is now presented, with specific non-limiting examples of some parameters drawn from the implementation example immediately above.

With $\psi_i(R, t)$, (i=1, 2, 3) representing the three components of an external wavefunction for bosons of the phase-coherent objects 100A and 100B (e.g., BECs) at time t and position R, the "dark state superposition" for a given phase-coherent object is given by $\Psi_D(R, t) = \psi_1(R, t)|1> + \psi_2(R, t)|2>$, where the amplitude and phase of the state |2> component relative to the state |1> component are determined by the amplitude and phase of the electric field of the optical probe pulse 120, $$E_p(R, t) = \frac{1}{2}E_p(R, t)e^{i(k_p \cdot R - \omega_p t)} + c.c.$$

(c.c. is the complex conjugate), relative to the electric field of the optical coupling beam 130, $$E_c(R, t) = \frac{1}{2}E_c(R, t)e^{i(k_c \cdot R - \omega_c t)} + c.c.,$$

according to:

$$\frac{\psi_2(R, t)}{\psi_1(R, t)} = -\frac{\Omega_p(R, t)}{\Omega_c(R, t)}e^{i(k_p - k_c) \cdot R - i(\omega_p - \omega_c)t} \quad (1)$$

In Eq. (1), $\Omega_p(R, t) = d_{31} \cdot E_p(R, t)/\hbar$ and $\Omega_c(R, t) = d_{32} \cdot E_c(R, t)/\hbar$ are the respective Rabi frequencies of the probe pulse 120 and coupling beam 130 (e.g., $\Omega_p = 2\pi \times 2.6$ MHz, $\Omega_c = 2\pi \times 2.6$ MHz), $d_{jk} = -e<j|r|k>$ are electric dipole matrix elements, $E_{p,c}$ are the slowly varying envelopes of the optical laser fields, –e is the electron charge and, $\hbar$ is Planck's constant. In one aspect of this embodiment, the anti-parallel orientation of the respective wavevectors for the probe pulse 120 and the coupling beam 130, $k_p$ and $k_c$, (see FIG. 4a) produces phase variation in the dark state on optical length scales.

According to Eq. (1), the variation of $\psi_2$ in space and time mimics that of the probe pulse 120 such that a slowly varying envelope of $\psi_2$ accompanies that of the highly compressed, slowly moving optical pulse through the condensate. With the optical probe pulse 120 thus contained in the first phase-coherent object 100A (see FIG. 4b), the coupling beam 120 is turned off (e.g., over 40 nanoseconds) leaving an imprint of the probe pulse's phase and amplitude in the form of atomic population amplitude in state |2>. More specifically, in order to preserve the dark state for the first phase-coherent object (Eq. (1)), the atoms coherently and adiabatically drive the probe pulse field to extinction, but the dark state imprint of the pulse remains in the first phase-coherent object. The spatial phase variation impressed on $\psi_2$ in this process corresponds to a two-photon recoil of $\hbar(k_p+k_c)/m$, where m is the atomic mass (for BECs of sodium-23 atoms, the two-photon recoil in the specific implementation example given above=59 μm/ms$^{-1}$). Hence a $\psi_2$ 'messenger' matter wave pulse 210 is ejected from its initial position in the same direction as the incident probe pulse 120, and ultimately leaves the first phase-coherent object 100A and travels as a coherent matter wave pulse towards, through and beyond the second phase-coherent object 100B (see FIGS. 4c and 4d). In particular, each atom's |2> component has a momentum corresponding to two photon recoils, i.e., absorption from the probe pulse 120 and stimulated emission into the coupling beam 130, and is ejected towards the second phase-coherent object.

When this messenger matter wave pulse is embedded in the second phase-coherent object 100B (see FIG. 4d), the second phase-coherent object is illuminated with the coupling beam 130. Even though the messenger matter wave pulse is alien to this second phase-coherent object, the atoms of the second phase-coherent object cooperatively generate a second "revived" optical pulse 190 that is qualitatively similar to the first probe pulse 120 (see FIG. 4e). The second revived optical pulse then propagates out of the second phase-coherent object under slow light conditions, with the propagation direction (+z) determined by the phase imprinted on the messenger atoms.

Before discussing the physics of optical pulse storage and revival (i.e., information storage and transfer) in separate phase-coherent objects, the process for a single phase-coherent object is considered. Optical pulses can be "revived" in a single phase-coherent object as long as the corresponding matter wave pulse carrying the imprint of the optical pulse remains within the phase-coherent object. In this case, the revival of an optical pulse can be described as resulting from an interference of each atom's wavefunction with itself. The $\psi_2$ imprint is much smaller than the extent of the $\psi_1$ wavefunction and has been translated (owing to two-photon recoil) from its original location. During revival, the coupling beam creates some $\psi_3$ amplitude sourced from the translated $\psi_2$ imprint, and hence a dipole moment, proportional to $\psi_1^*(R)$ $\psi_3(R)$, is generated in each atom, which regenerates or "revives" the optical probe pulse field.

As the system is driven into the dark state, described by Eq. (1), the ratio between the value of the initial $\psi_1$ at the storage location and of $\psi_1$ at the revival location is mapped onto the regenerated optical probe pulse. The $\psi_2$ imprint is coherently added to $\psi_1$ at the revival location as the optical pulse subsequently leaves the region under slow light conditions. This scenario shows that a direct measurement of the one-body density matrix of the phase-coherent object can be made by recording the revived optical pulse energy as a function of the distance between the storage and revival locations. That light pulse revival is possible over the full length of the phase-coherent object reflects the object's off-diagonal long-range order.

When optical pulse storage and revival occur in two different phase-coherent objects separated before condensation, each atom's wavefunction is initially localized to either but not both of the two isolated phase-coherent objects. Therefore, the dark state superposition imprinted during storage exists only for atoms of the first phase-coherent object. Nevertheless, a coherent optical pulse can still be revived from the second phase-coherent object through bosonic matter wave stimulation. The interaction between light and matter is governed by the Hamiltonian $$\hat{H}_{int} = -\frac{1}{2}\int dR \begin{pmatrix} d_{31}^* \cdot \hat{E}_p^{(-)}(R)\hat{\psi}_1^\dagger(R)\hat{\psi}_3(R) + \\ d_{32} \cdot \hat{E}_c^{(+)}(R)\hat{\psi}_3^\dagger(R)\hat{\psi}_2(R) + h.c. \end{pmatrix} \quad (2)$$

where $\hat{\psi}_i^\dagger(R)$ and $\hat{\psi}_i(R)$ are creation and annihilation operators for an atom in internal state |i> at position R, and h.c. indicates the hermitian conjugate. Here, the laser fields also are expressed in second quantized form to stress the symmetry of the matter and light fields discussed below. During revival, when the coupling laser beam creates a population amplitude in |3> (second term in Eq. (2)), the presence of a phase-coherent object in |1> creates a large rate for bosonic stimulated scattering of atoms into the condensate mode (due to the presence of $\overline{\psi}_1^t$ in the first term of Eq. (2)). This bosonic stimulation drives the probe pulse field on, and the four interaction terms of $\hat{H}_{int}$ in combination drive the system into a dark state. In this scenario, the field associated with the coupling beam and the matter field for atoms in |1> form a perfectly symmetric pair: bosonic stimulation into a macroscopically occupied photon field (the coupling beam) drives coherent dynamics during the initial optical probe pulse injection, whereas stimulation into a macroscopically occupied matter field (the second |1> phase-coherent object) secures coherence during generation of the second optical pulse (i.e., regeneration of the first optical probe pulse).

For optical pulse revival and optical information storage/transfer to succeed with two distinct objects, each object must have a macroscopic population of a given quantum state. Thus, in one embodiment as discussed above, the two phase-coherent objects between which information may be transferred may be two Bose-Einstein condensates (BECs) of identical bosons, each with a macroscopic number of bosons in the condensate phases. In another embodiment, the two phase-coherent objects may be two superfluids of the same kind (e.g., $^4$He superfluids) with a macroscopic number of identical bosons that are Bose-condensed in each fluid. In yet another embodiment, the phase-coherent objects may be two superconductors, with the two superconductors being of the same or different materials. In yet another embodiment, the phase-coherent objects may include fermionic superfluids of the same kind (e.g., $^3$He) with a macroscopic number of Cooper pairs that are Bose-condensed in each. As illustrative examples, the many-body system of bosons (including Cooper pairs) that form a phase-coherent object can be in a "number state" or a "coherent state."

In all of the foregoing examples, a Bose-Einstein condensate of bosons (including Cooper pairs of fermions) is present in the phase-coherent objects, and the rate of coherent emission events in the revival process is determined by the Bose stimulation factor, $\overline{\psi}_1 \overline{\psi}_1$, for scattering into the second phase-coherent object. For a macroscopic occupation of this object, the stimulated processes completely dominate the spontaneous ones. By contrast, if the atoms formed a degenerate Fermi gas, attempts at revival in the second phase-coherent object would lead to emission rates below even the spontaneous rate obtained from a non-condensed, bosonic cloud. It should also be noted that in embodiments in which the two phase-coherent objects are created independently, they have a completely random relative phase. Therefore, interference experiments in which the revived optical pulse interferes with a reference pulse would lead to high-contrast interference in each shot, but with random absolute fringe position.

Figure 5:
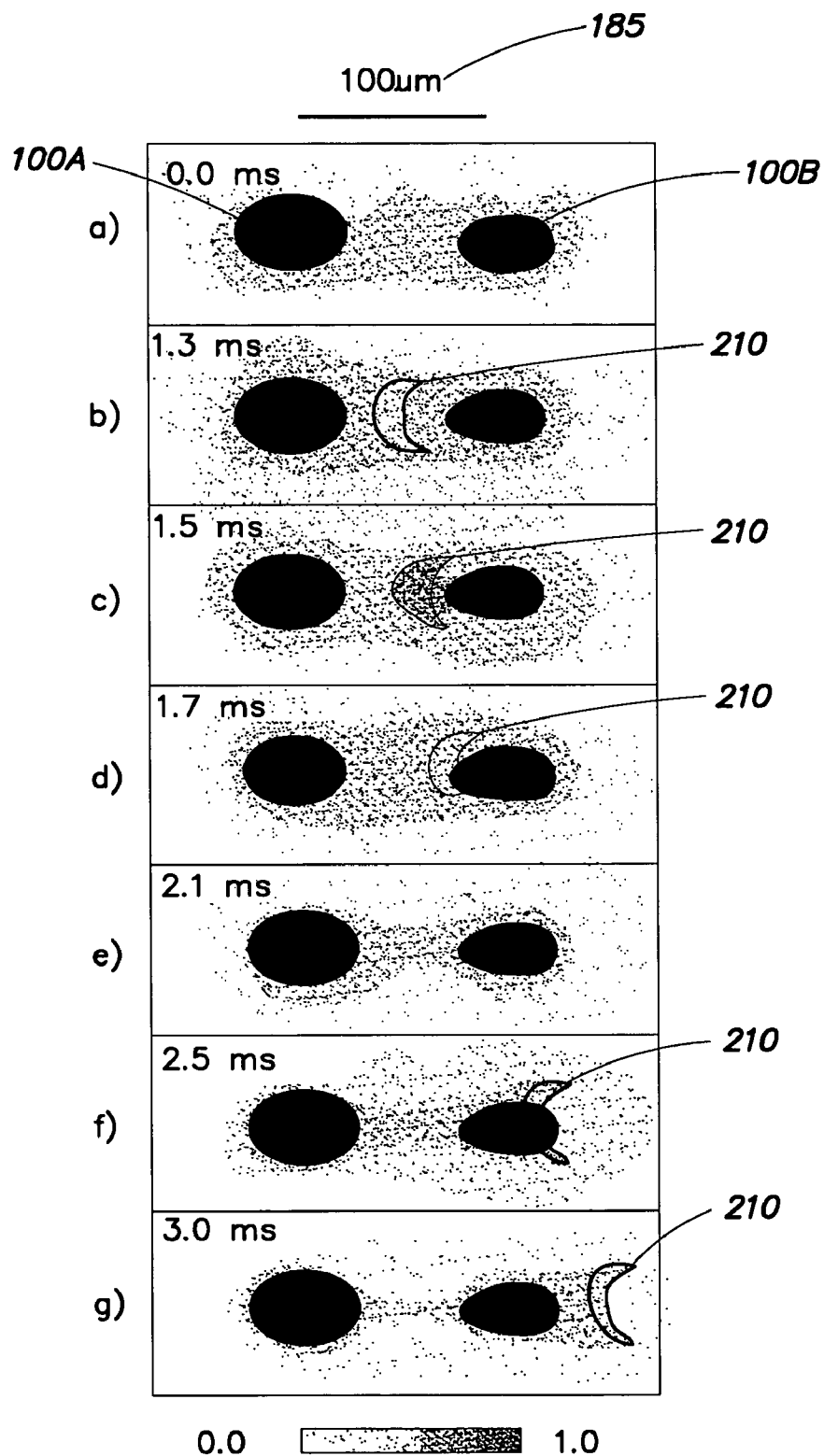
FIGS. 5*a* through 5*g* illustrate a timed-series of actual resonant absorption images of two phase-coherent objects and a "messenger" coherent matter wave pulse travelling between the two phase-coherent objects, according to one embodiment of the present invention.
Figure 6:
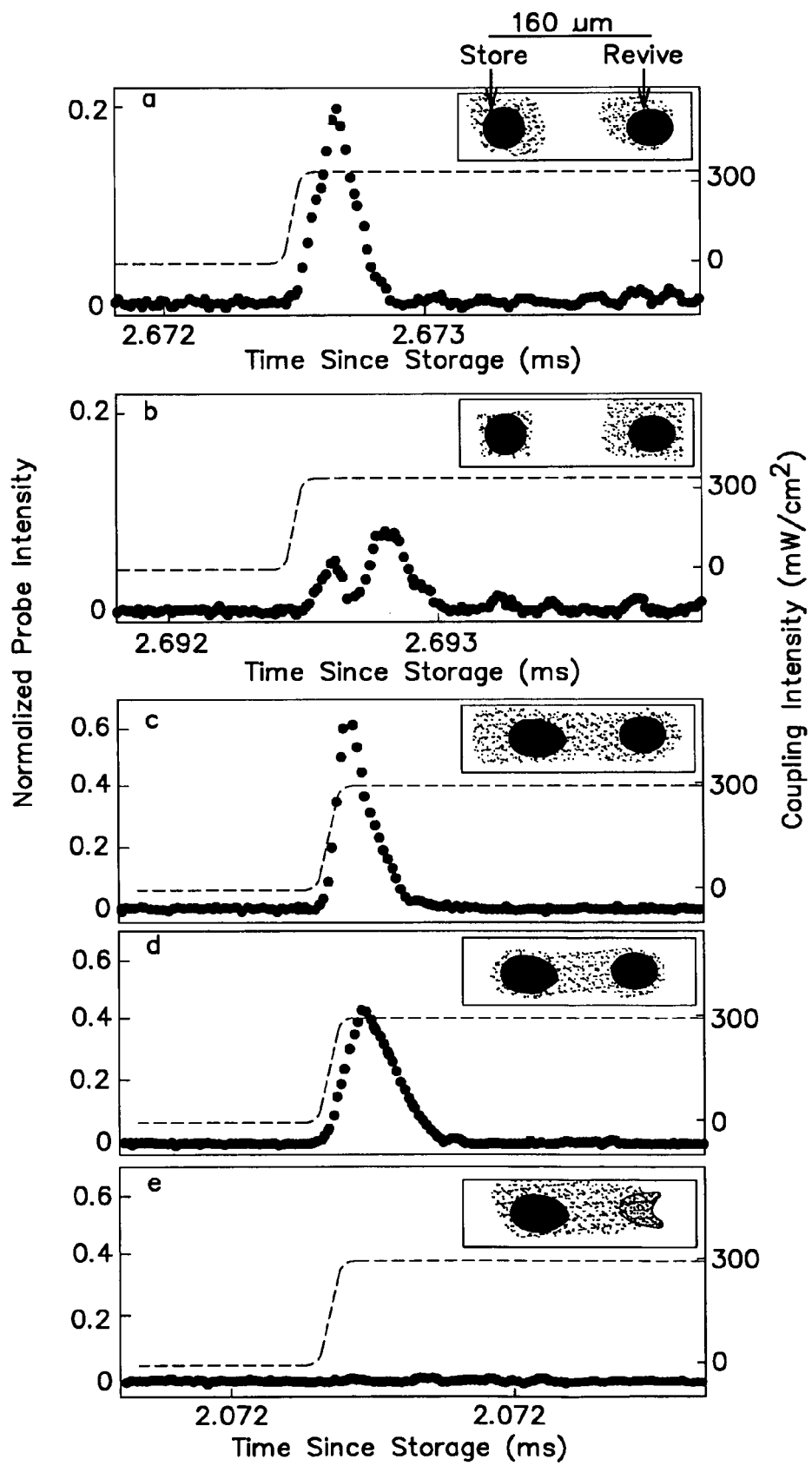
FIGS. 6*a* through 6*e* comparatively illustrate some of the dynamics involved in information storage and transfer in the form of optical pulse storage and revival in two separate phase-coherent objects, according to various embodiments of the present invention.

FIGS. 5a through 5g illustrate a time-series of actual resonant absorption images of two phase-coherent objects 100A and 100B (e.g., BECs) and a "messenger" coherent matter wave pulse 210 travelling between them, pursuant to the present disclosure. The images in FIGS. 5a through 5b are based on a system 500 according to the exemplary implementation discussed immediately above (i.e., including BECs of sodium-23 atoms), and the indicated times in the respective images (e.g., 0.0 ms, 1.3 ms, 1.5 ms, 1.7 ms, 2.1 ms, 2.5 ms, and 3.0 ms) are given relative to storage of the optical probe pulse 120 in the first phase-coherent object 100A (i.e., from the moment at which the coupling beam 130 is turned off once the pulse 120 is completely embedded in the first phase-coherent object). In the demonstration depicted for the time-series of images shown in FIGS. 5a through 5g, the coupling beam 130 is not turned on again once the matter wave pulse 210 is embedded in the second phase-coherent object 100B, so as to demonstrate the general nature of propagation of the matter wave pulse 210. In particular, as shown in FIG. 5g, absent re-energizing the coupling beam 130, the matter wave pulse 210 is observed to travel through and beyond the second phase-coherent object 100B.

FIGS. 6a through 6e comparatively illustrate some of the dynamics involved in information storage and transfer in the form of optical pulse storage and revival in two separate phase-coherent objects. In these figures, revived probe pulses, normalized to input pulse intensity, are plotted against time since pulse storage (dots, left-hand axis), and simultaneously recorded coupling intensity (dashed line, right-hand axis). The insets are resonant absorption images of |1> BECs, 20 microseconds after revival. The revived optical pulses are detected on a photomultiplier tube by imaging the pulse onto a 50 μm pinhole to reject background light.

FIGS. 6a and 6b show optical pulses revived in the second of a pair of independently condensed BECs. In FIG. 6a, the optical pulse is revived in the second BEC after 2.67 ms during which time the |2> atom pulse travels 157 micrometers. In this instance, the Rabi frequency of the coupling beam during revival is $\Omega_{c,revival}=2\pi\times21.4$ MHz, resulting in a temporally narrowed output pulse. In FIG. 6b, the messenger |2> matter wave pulse travels to a different location in the second BEC, where differences in density and phase patterns between the two lead to a bimodal structure.

FIGS. 6c and 6d illustrate revived optical pulses from BECs formed by adiabatically splitting a single magnetically trapped BEC with a 1.5μ-tall light barrier, ramped up over 100 ms, and held constant for 1 s. In FIG. 6c, a typical pulse contains $6.9\times10^3$ photons, 2.2% of the input pulse energy. In FIG. 6d, a larger, denser second BEC yields a slower light propagation speed and a broader and less intense pulse, with similar energy to the pulse shown in FIG. 6c. Finally, FIG. 6e illustrates a control experiment in which experimental timing and conditions were exactly the same as in FIGS. 6c and 6d, but with no second BEC.

Figure 7:
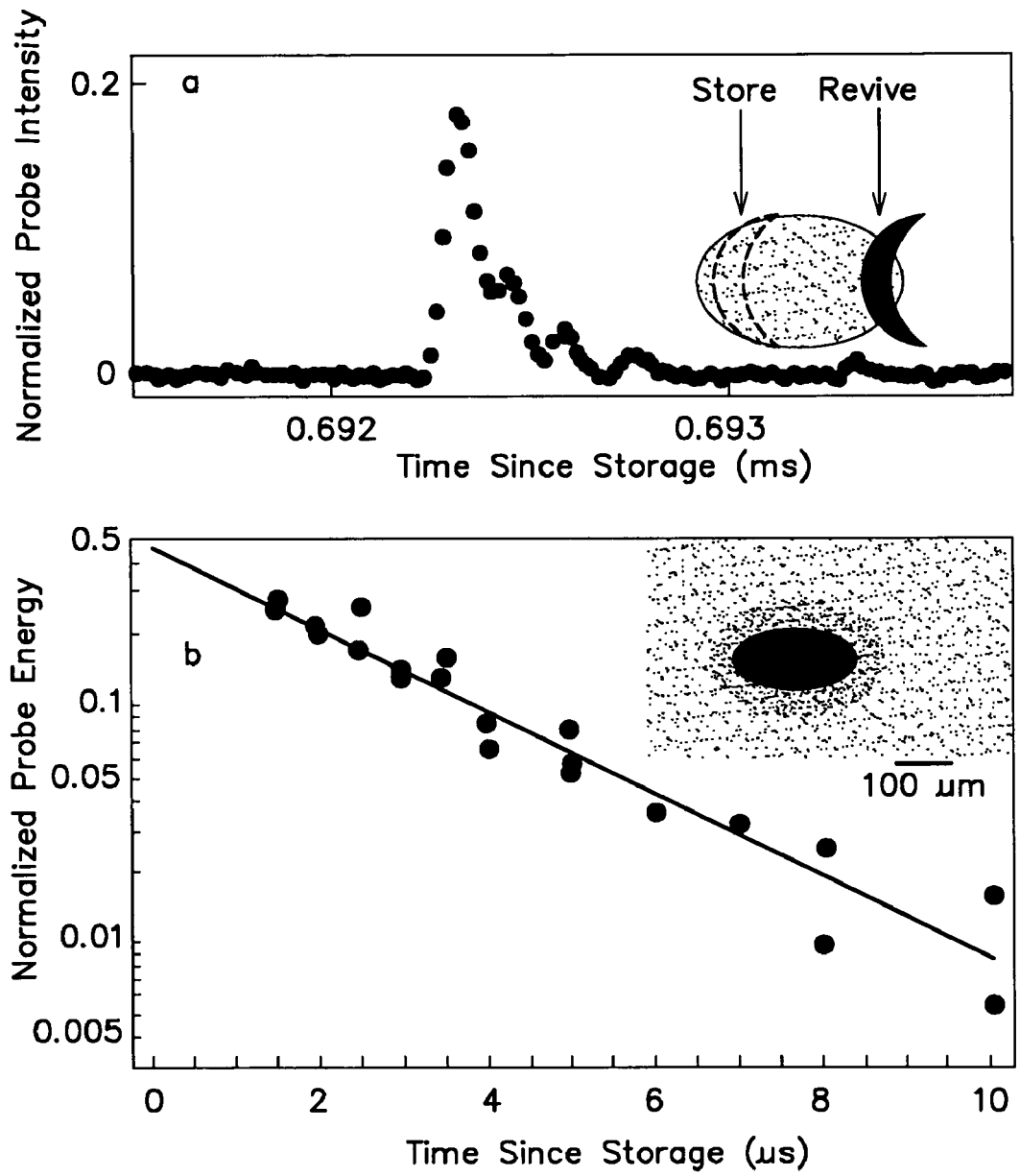
FIGS. 7*a* and 7*b* illustrate comparative examples of optical pulse revival in a single condensate as opposed to two separate phase-coherent objects.

To illustrate a comparison between optical pulse revivals from two spatially separated phase-coherent objects and previous work relating to optical pulse revivals in single condensates, FIG. 7a shows a light pulse revived at the right end of a single BEC of $3.4\times10^6$ atoms, 0.69 ms after storage in the left end. The single BEC was prepared in a harmonic magnetic trap ($\omega_z=2\pi\times20$ Hz, $\psi_r=2\psi_z$). All light parameters are similar to those discussed above in connection with FIGS. 6a through 6e. FIG. 7b illustrates decay of the revival signal in a single thermal cloud. The energy of the revived light pulse is plotted as a function of time since pulse storage. The thermal cloud (inset) has $13.5\times10^6$ atoms at 470 nK, just above the critical temperature for BEC (340 nK) in the trap described in FIG. 7a. The input probe Rabi frequency is $2\pi\times3.2$ MHz; coupling storage and revival Rabi frequencies are $2\pi\times3.5$ and $2\pi\times17.5$ MHz, respectively.

Whereas the BECs in FIGS. 6a and 6b are condensed in separate potential wells, those in FIGS. 6c and 6d are formed by adiabatically separating an already-formed condensate. No qualitative difference is observed between revivals in a single condensate (FIG. 7a), in adiabatically formed condensate-pairs (FIGS. 6c, 6d), or in condensates that have always been separate (FIG. 6a). In all cases, no atoms are observed when state |1> is selectively imaged after the probe light pulse has been revived, indicating that the messenger matter wave pulse has been fully converted to light and state |1> atoms. Again, no revived optical pulse is observed when an isolated messenger matter wave pulse is illuminated with the coupling beam (FIG. 6e).

With reference again to FIG. 6b, this figure shows a bimodal revival pulse obtained under the same conditions as in FIG. 6a, except that the messenger matter wave pulse is allowed to propagate to a different location in the second |1> BEC before the second optical pulse is generated (i.e., the first optical pulse is revived as the second optical pulse). Between storage and revival times, coherent atom dynamics create phase gradient differences and a different position-dependent density ratio between the messenger matter wave pulse and the second |1> BEC. This determines the structure of the revived light pulse, as confirmed by numerical simulations.

These observations demonstrate coherent processing of optical information. In one aspect, expansion dynamics due to repulsive atom-atom interactions in the BECs after trap turn-off create ~0.5 rad $\mu m^{-1}$ phase variations during the storage time. As controlling the revival time to within tens of microseconds controls the propagation depth of the messenger matter wave pulse to micrometer precision, the second optical pulse can be revived at locations where the phase patterns of the messenger matter wave pulse and second BEC match. This leads to revived optical pulses with the same shape as the incoming optical probe pulse (FIG. 6a). For other propagation distances of the messenger matter wave pulse, various phase patterns can be imprinted on the revived second optical pulse, and differently shaped revival pulses are recorded at the photomultiplier. In one embodiment, this coherent processing is controlled in trapped phase-coherent objects, for example, by way of manipulation of atomic scattering lengths with Feshbach resonances.

Thus, in some embodiments, methods, systems and apparatus for information storage, transfer and control (processing) according to the present disclosure include control of storage and revival times for optical information, in some cases so as to process, alter or otherwise manipulate one or more characteristics of the stored/transferred information. With reference again to the system 500 shown in FIG. 2, it should be readily appreciated that in one embodiment, the controller 137 may be particularly configured to control at least the radiation source 135 to energize and extinguish the coupling beam 130 so as to control one or both of the storage time and revival time for the optical information.

Loss of |2> amplitude in the messenger matter wave pulse from atom-atom scattering, together with a roughly 50% loss from optical pulse propagation in the first phase-coherent object before storage, account for the difference in energy between the incident first optical probe pulse 120 and the "revived" second optical pulse 190; there are no detectable losses from the storage and revival processes themselves. By careful selection of atomic species, magnetic sublevels, and manipulation of scattering lengths, both slow light and matter wave pulse propagation losses may be minimized. In another aspect, shaping the density profile of the |1> phase-coherent objects may increase the optical bandwidth of the process and further minimize losses.

The retrieval of optical information from a second phase-coherent object after optical storage in a completely separate first phase-coherent object is a result of slow-light-mediated atomic matter-wave amplification, which fully converts and coherently adds a messenger matter wave pulse of state |2> atomic amplitude to a receiving |1> phase-coherent object. In one exemplary implementation, coherent matter wave pulses may repeatedly be moved from one phase-coherent object to another, which may be used as a replenishing scheme in a continuous-wave atom laser. In another exemplary implementation, the method and system described above may also form the basis for an interferometer in which spatially selected parts of an atomic wavefunction interfere. As demonstrated for bosons, such interferometry can be used for measurements of off-diagonal long-range order in spatially selected regions of degenerate gases of fermions and bosons.

In yet another embodiment, coherent optical information processing with matter wave dynamics may be accomplished with a single phase-coherent object according to the principles outlined above. For example, with reference to FIG. 8, which schematically outlines a method and system for information processing using a single phase-coherent object, in the presence of an optical coupling beam 130 (generated by a radiation source 130 that is responsive to controller 137), a first optical pulse 120 is injected into the phase-coherent object 100A, where it is spatially compressed to a length much shorter than the coherent extent of the object. The coupling beam 130 is then turned off, leaving the atoms in the phase-coherent object 100A in quantum superposition states that comprise a stationary component and a recoiling component in a different internal state. The amplitude and phase of the spatially localized first optical pulse are imprinted on the recoiling part of the object's wavefunction, which moves out of the phase-coherent object as a messenger matter wave pulse 210 that carries information 150 associated with the first optical pulse 120. While this matter wave pulse 210 is outside of the phase-coherent object 100A (e.g., in free space), it can be held, or manipulated/processed, by a processor 250, and then sent back to the phase-coherent object 100A. When the matter wave pulse 210 arrives back to and is embedded in the phase-coherent object 100A, the object 100A is re-illuminated with the coupling beam 130. A second optical pulse 190 is thusly generated from the phase-coherent object 100A, and the returned messenger matter wave pulse is coherently added to the matter field of the object by way of slow-light-mediated atomic matter-wave amplification. The revived second optical pulse 190 records the relative amplitude and phase between the original matter wave pulse at the storage time and the generation of the second optical pulse at revival time (upon return of the matter wave pulse 210 to the phase-coherent object).

More specifically, with reference to the discussion above in connection with BECs, in one embodiment the |2> component of the wavefunction of the bosons in the BEC (the 'messenger' matter wave pulse 210) is brought out of the |1> BEC and thereby isolated from the |1> BEC during the storage or processing time. If the two condensate components (of |1> and |2> atoms) subsequently phase de-cohere (develop a non-deterministic relative phase, which occurs for long processing times), the optical information nonetheless can be "read out" when the |2> component returns into the |1> component. The absolute phase of the revived light is not known, but no information is carried in the absolute phase (which is just a reference). Accordingly, the matter imprint of the light pulse (i.e., the |2> component or matter wave pulse 210) can be selectively manipulated by the processor 250 when it is isolated from the |1> component, without touching the "readout medium," i.e., the phase-coherent object 100A. Also, according to another aspect, dephasing times can be significantly improved, thereby increasing the available time for processing, since the two components only co-exist when light is converted to matter or vice versa (i.e., they are separated during the actual processing).

Figure 8:
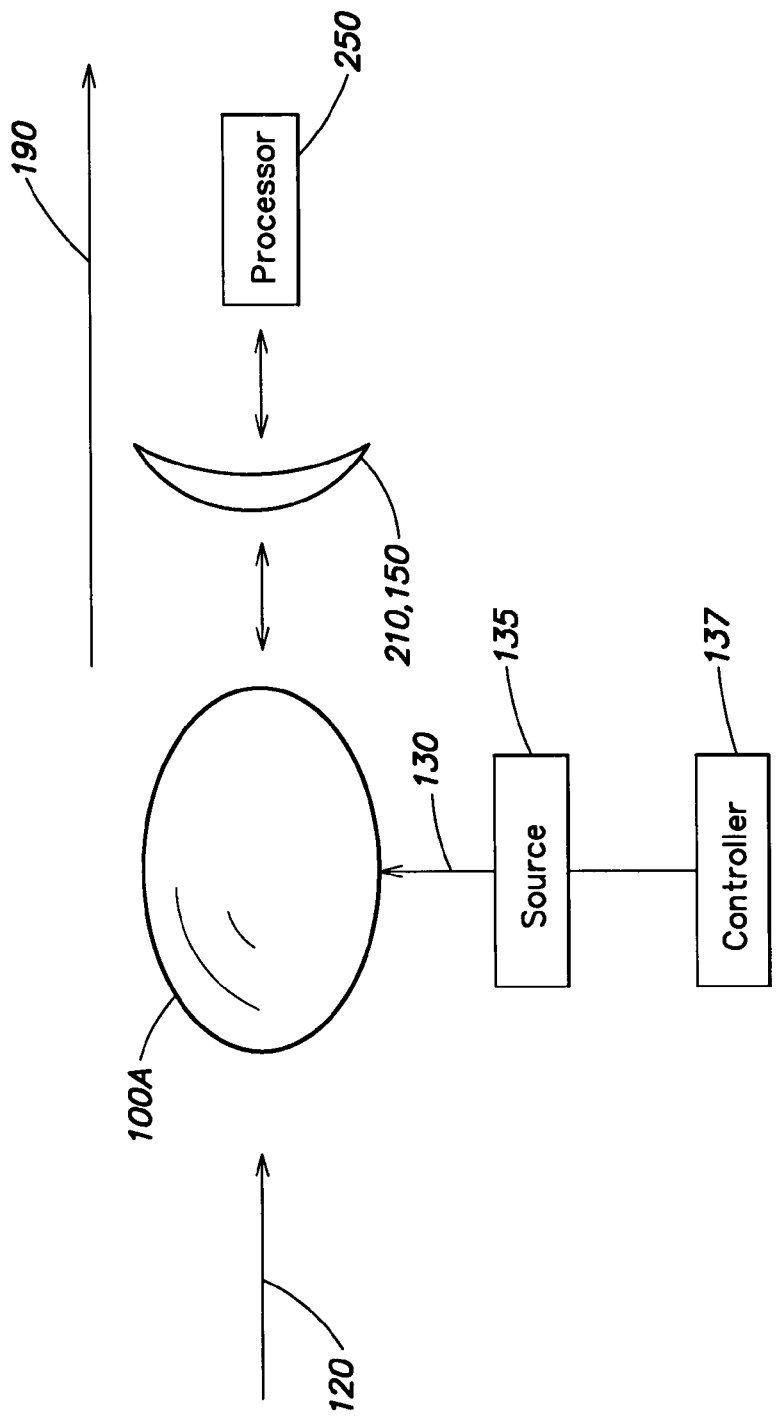
FIG. 8 schematically outlines a method and system for information processing using a single phase-coherent object, according to one embodiment of the present invention.

In other aspects of information processing using a single phase-coherent object as shown in FIG. 8, gravity may be employed to return the messenger matter wave pulse 210 back to the object; for example, while not explicitly shown in FIG. 8, the messenger matter wave pulse 210 may be propagated up vertically, or almost vertically (to allow for read out in a different part of the phase-coherent object 100A) and allowed to come back down (due to the gravitational force) to the object, in which case the generated optical pulse 190 would propagate in the opposite direction to the original propagation direction (coming in). In this example, the propagation direction for the coupling beam 130 should also be reversed. Moreover, the processor 250 may employ electric fields, magnetic fields, RF fields, or optical fields, or any combination thereof, to direct the messenger matter wave pulse 210 back into the phase-coherent object 100A.

In yet another embodiment, the processing of information carried by the coherent matter wave pulse 210 (i.e., the imprint of the first optical pulse), as outlined in FIG. 8, may be implemented for systems and methods involving two spatially-separated phase-coherent objects, as discussed above in connection with FIGS. 1 through 4. In particular, as the matter wave pulse 210 travels between first and second phase-coherent objects, a processor 250 may alter at least one characteristic associated with the matter wave pulse 210 so as to manipulate the information carried by the matter wave pulse.

In sum, coherent optical information processing with matter wave dynamics is accomplished between two phase-coherent objects or using a single phase-coherent object. In exemplary embodiments, optical information is imprinted on a Bose-condensed atom cloud, quantum coherent atom dynamics alter the atomic imprint during the storage time, and finally the result is written back onto propagating optical fields. The methods, systems and apparatus discussed herein have significant utility for applications involving classical and quantum information processing. As the messenger matter wave pulse 210 travels between two phase-coherent objects, or outside of a single phase-coherent object (e.g., in free space), it can be independently trapped—potentially for minutes—and manipulated with external fields (e.g., via the processor 250). In various examples, the optical probe pulse 120 may be in either a classical state or a quantum (e.g., squeezed) state, and the processor 250 may be configured so as to manipulate the matter wave pulse 210 to place it in a classical state or a quantum (e.g., squeezed) state. Resulting classical and quantum states of the processed matter wave pulse 210 can then be mapped onto revived/regenerated fields associated with the second optical pulse 190. Various implementations of the inventive methods and systems disclosed herein are capable of appreciably large optical delay-bandwidth products (e.g., on the order of $\sim 10^3$-$10^4$), demonstrating the suitability of the methods and systems disclosed herein for implementations of dynamically controllable optical delay lines (or "optical buffers") as well as optical memory devices.

With reference again for the moment to FIG. 2, in yet other embodiments, a system 500 for information storage and transfer between two phase-coherent objects 100A and 100B as shown in FIG. 1, or for processing of information based on a single phase-coherent object as shown in FIG. 8, may employ electro-optical trapping techniques (rather than the trapping techniques discussed above in connection with FIG. 2) to facilitate trapping and cooling of the phase-coherent object(s). In general, as noted earlier, trapping and cooling of the phase-coherent object(s) in various embodiments involves creating an attractive magnetic or electric potential which is balanced by a repulsive potential provided by an optical field. In some embodiments discussed in further detail below, trapping and cooling of the phase-coherent object(s)

may be accomplished via an electro-optical technique employing nanoscale structures (structures having dimensions on the scale of nanometers, e.g., nanotubes, nanowires, nanocylinders, nanospheres, etc.) to create attractive potentials from static electric fields, which are balanced by a repulsive optical potential. In some exemplary implementations, inventive electro-optical atomic trapping methods and apparatus according to the present disclosure, based on nanoscale structures, facilitate integrated silicon wafer-based realizations of the inventive methods and systems discussed above in connection with FIGS. 1 through 8.

The internal quantum states of neutral atoms couple to laser light via their electric dipole moment, and this coupling can in turn affect the center-of-mass motion of atoms. In this manner, laser light can be used to trap and cool neutral atoms. Compared to magnetic microtraps, optical traps on a nanoscale offer increased trap depth and cooling of the atomic motion. While some designs for atomic traps near nanostructures have been proposed in the academic literature, methods for dealing with the van der Waals forces near the material surface, as well as providing a viscous force to load and stabilize the trap, have not yet been proposed.

In view of the foregoing, Applicants have recognized and appreciated that surface plasmons may be significant in the context of electro-optical nanoscale traps to address the issues of van der Waals forces and loading and stabilizing of the trap. Metallic nanoparticles are known to exhibit optical resonances based on surface plasmons, at which nanometer-scale focusing and associated large enhancements of the electromagnetic field occur. Applicants have recognized and appreciated that a strong plasmon-enhanced laser field in proximity to a nanostructure may be employed not only to counter an attractive electrostatic potential generated by the nanostructure, but additionally to damp atomic motion, thereby enabling stable and truly nanoscale atomic traps.

Accordingly, some embodiments of the present invention are directed to nanoscale electro-optical atomic trapping methods and apparatus based at least in part on the combined attractive potential of a static electric field generated by nanostructures, and a repulsive potential of an appropriately tuned optical (laser) field. In one aspect of this embodiment, the nanostructures are particularly configured to facilitate surface plasmon-enhanced laser field gradients proximate to the nanostructures, and in turn these plasmon-enhanced laser field gradients provide a viscous damping force that significantly facilitates loading and stabilizing of the trap.

Figure 9:
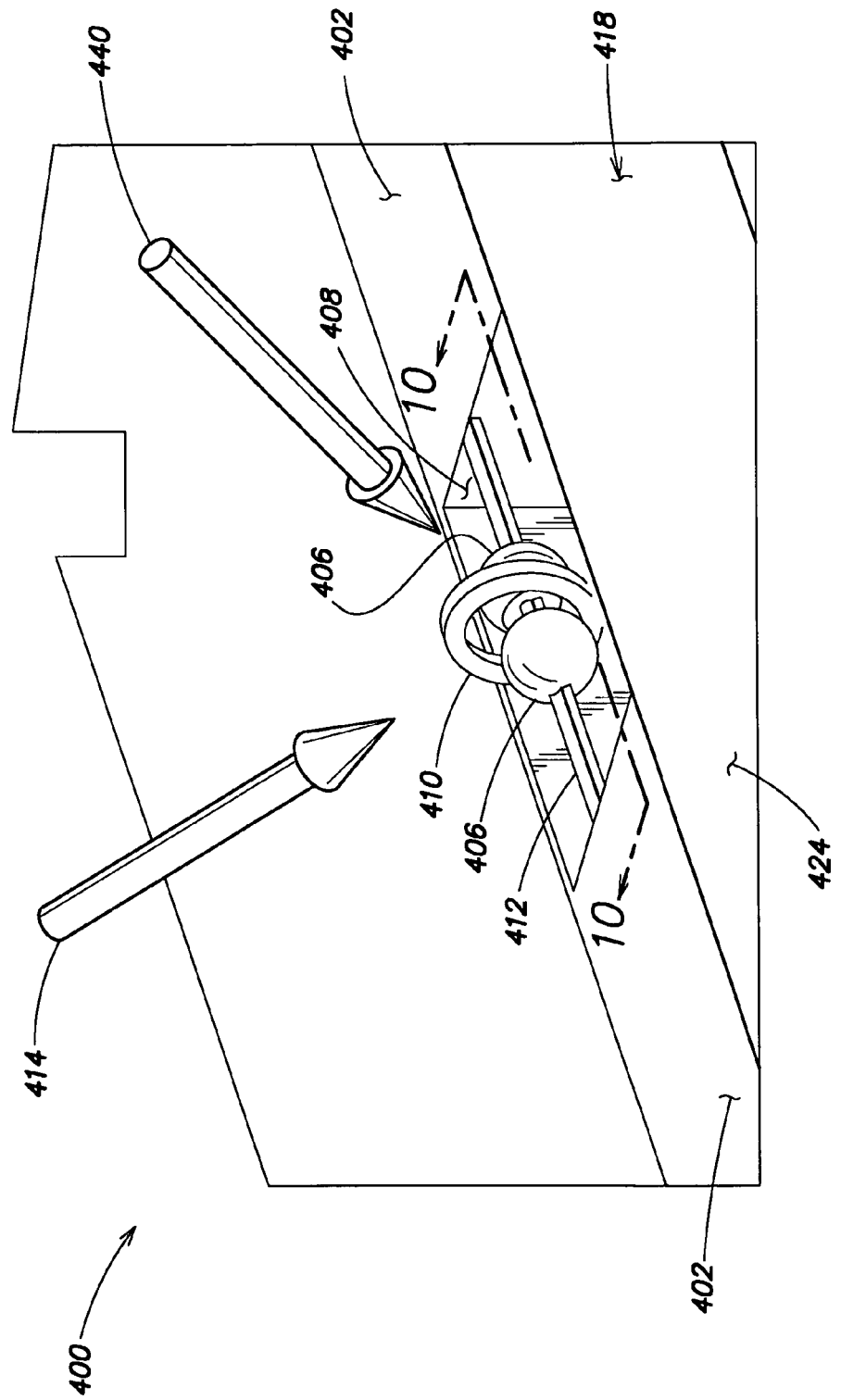
FIG. 9 illustrates a perspective view of an electro-optical atomic trapping apparatus according to one embodiment of the present invention.

FIG. 9 illustrates a perspective view of an electro-optical atomic trapping apparatus 400 according to one embodiment of the present invention. For purposes of illustrating the various concepts germane to electro-optical trapping methods and apparatus according to the present disclosure, the trapping apparatus 400 of FIG. 9 is suitable for forming a "single potential well" trap, e.g., for one phase-coherent object. It should be appreciated, however, that the various concepts discussed in detail below in connection with FIG. 9 may be readily employed to realize "multiple potential well" electro-optical trapping methods and apparatus for trapping two or more phase-coherent objects (as discussed below in connection with FIGS. 13-15). Accordingly, a "double potential well" electro-optical trapping apparatus may be employed in a system similar to that shown in FIG. 2 for storage, transfer and/or control of information via matter wave dynamics between two phase-coherent objects.

In the apparatus 400 of FIG. 9, a nanoscale wire 412 (e.g., a single-walled carbon nanotube), is attached at each end to electrodes 402 and 404 and suspended above a gap 408 in a support structure 418. As discussed further below, the support structure 418 may include a substrate such as glass or silicon, and the gap 408 may result from a well or trench formed in the support structure, or an aperture that passes completely through the support structure. As shown in FIG. 9, the suspended nanoscale wire 412 supports two or more three-dimensional conductive (e.g., metallic or metal-coated dielectric) nanostructures 406 (e.g., nanocylinders or nanospheres) located along the nanoscale wire 412 within the area of the gap 408. In various aspects, the nanoscale wire 412 provides both mechanical stability and an electric conduction path for charging the nanostructures 406. While two nanostructures 406 are shown in FIG. 9, it should be appreciated that the embodiment of FIG. 9 is not limited in this respect, as various numbers of nanostructures may be introduced along a length of the nanoscale wire 412 at various predetermined (e.g., controlled) locations, including a single nanostructure or a periodic array of more than two nanostructures. In one exemplary implementation, the nanostructures 406 may be silver or silver-coated aluminum oxide nanospheres having a diameter of approximately 90 nanometers and separated by approximately 2 nanometers.

In FIG. 9, a voltage applied to the nanoscale wire 412 and in turn to the nanostructures 406, via one or more of the electrodes 402 and 404, provides an attractive electrostatic potential for atoms proximate to the nanostructures 406. An optical trapping field 440 in the form of a laser beam (similar to the optical trapping field 140 shown in FIG. 2) is directed at the region containing the nanostructures 406. In one aspect, the optical trapping field is blue-detuned from the atomic resonance of the atoms to be trapped, so as to provide a repulsive optical potential that keeps atoms off of the surface of the nanostructures 406. The combination of the attractive electrostatic potential from the nanostructures 406 and the plasmon-enhanced repulsive optical potential from the optical trapping field 440 form a cylindrically-symmetric toroidally-shaped potential minimum trapping region 410. In particular, the blue-detuned optical trapping field 440 provides a barrier to overcome the attractive van der Waals potential near the surface of the nanostructures 406. Furthermore, due to surface plasmon-based optical resonances of the conductive nanostructures 406, the optical field 440 is significantly enhanced proximate to the nanostructures 406 so as to provide a viscous damping force for loading and stabilizing the trap. Atoms of an atom stream 414 (e.g., an atom beam) launched toward the nanostructures 406 rapidly lose kinetic energy due to the plasmon-enhanced field gradients of the optical trapping field 440.

Figure 10:
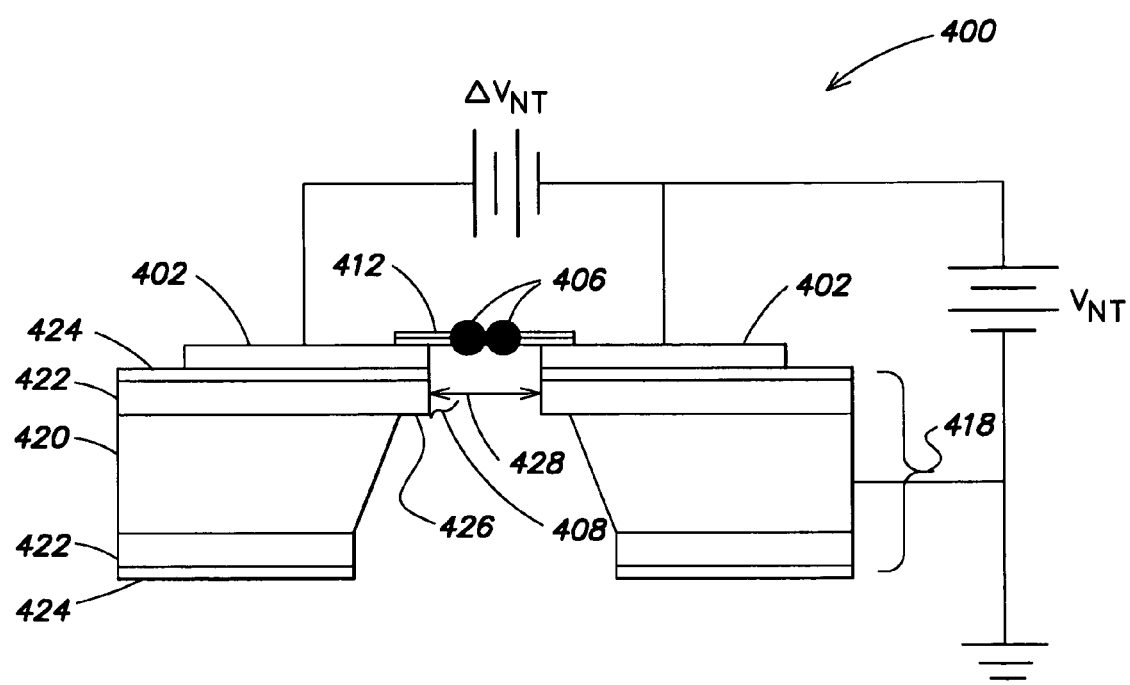
FIG. 10 illustrates a more detailed side view of a portion of the electro-optical atomic trapping apparatus of FIG. 9, according to one embodiment of the present invention.

FIG. 10 illustrates a more detailed cross-sectional side view of a portion of the electro-optical atomic trapping apparatus 400, taken along the line I'-I' in FIG. 9, according to one embodiment of the present disclosure. It should be appreciated that the apparatus details shown in FIG. 10 provide merely one exemplary implementation, and that atomic trapping apparatus according to the present invention are not limited to the specific example shown in FIG. 10. Exemplary techniques for fabricating at least some portions of the apparatus 400 shown in FIG. 10 are provided in International Publication Number WO 2005/000739 A1, published Jan. 6, 2005, entitled "Carbon Nanotube Device Fabrication," which publication is hereby incorporated by reference herein.

In the apparatus 400 shown in FIG. 10, the nanoscale wire 412 (e.g., a single-walled carbon nanotube) extends across the support structure 418 constituted at least by a substrate 420. Examples of suitable substrates 420 include, but are not limited to, silicon, glass, and sapphire. A well, trench or aperture is formed through at least a portion of the thickness of the support structure 418 so as to provide the gap 408 on at least one surface of the support structure, which gap is traversed by the nanoscale wire 412; in the example of FIG. 10, an aperture extends completely through the support structure, such that the nanoscale wire 412 forms a bridge across the gap 408 and can be accessed essentially unobstructed from either above or below the support structure 418. In one exemplary implementation, the substrate 420 may be a silicon substrate having a thickness of approximately 500 micrometers. A membrane including one or more layers may be disposed on a surface of the substrate 420 to provide support for the nanoscale wire 412 as well as electrical insulation between the wire and the substrate. For example, in one implementation, a first layer 422 of silicon dioxide ($SiO_2$) having a thickness of approximately 2 micrometers may be formed on the silicon substrate 420, and a second layer 424 of silicon nitride ($Si_3N_4$) having a thickness of approximately 200 nanometers may be formed on the first layer 422 of silicon dioxide (these layers may be formed in a conventional manner, e.g., by low pressure chemical vapor deposition (LPCVD)). To provide for the gap 408, and optionally a free-standing membrane of the one or more layers 422 and 424, the substrate first may be etched in a conventional matter (e.g., for silicon substrates, anisotropic wet etching by potassium hydroxide (KOH) may be employed) through its thickness to the first layer 422 of the membrane.

Subsequently, one or more metal layers 402 (e.g., gold, chromium, platinum, palladium) may be deposited before or after nanotube growth for forming electrically conducting contact pads to provide electrical connection to the nanoscale wire 412 shown in FIG. 10, with the one or more intervening layers 424 and 422 of the membrane providing electrical insulation from the substrate 420. A layer of nanotube synthesis catalyst (not shown in FIG. 10) is deposited on top of or below the metal layer(s) 402 in FIG. 10 to facilitate generation of the nanoscale wire 412; examples of materials suitable for a nanotube synthesis catalyst include, but are not limited to, iron, cobalt, nickel, or alloys of these materials. In exemplary implementations, such a catalyst layer may be on the order of 2 nanometers to facilitate single-walled nanotube growth (catalyst layer thickness is related to nanotube diameter and generation of single-walled vs. multi-walled structures). Once the catalyst layers are formed at selected sites on the support structure, an aperture is formed through the metal layer(s) (if already present) and the membrane (including the one or more layers 424 and 422), across which the nanoscale wire 412 is to be provided (various conventional methods, such as lithographic patterning/etching of the membrane layer(s), or focused ion beam milling, may be employed to form the aperture). In this manner, the aperture is completed through the substrate 420, the membrane layer(s) 422, 424, and the metal layer(s) 402 (if already present), such that synthesis of the nanoscale wire 412 may take place across the gap 408. In one exemplary implementation, a width 428 of the gap traversed by the nanoscale wire may be on the order of approximately 10 micrometers. Nanotube growth from the catalyst layer is carried out in a furnace at a temperature of between about 600 degrees C. to 1500 degrees C., and preferably about 900 degrees C.

With respect to formation of the nanostructures 406 in the apparatus 400 shown in FIGS. 9 and 10, a single-walled carbon nanotube serving as the nanoscale wire 412 may be coated with various materials via chemical vapor deposition (CVD) or atomic layer deposition (ALD) so as to form one or more of the nanostructures 406. Some exemplary coating techniques for carbon nanotubes suitable for purposes of the present disclosure are described in detail in International Publication Number WO 2005/124888 A1, Published Dec. 29, 2005, entitled "Suspended Carbon Nanotube Field Effect Transistor," which publication is hereby incorporated herein by reference. CVD techniques (particularly low pressure, i.e. LPCVD, techniques) can be employed to coat nanotubes with any of a wide range of materials including, but not limited to, nitrides, oxides (including metal oxides), polysilicon, metals, and semiconducting materials. Likewise, ALD techniques may be employed to deposit oxides, including metal oxides, and some metals. Particular techniques for gas-phase functionalization of single-walled carbon nanotubes to facilitate ALD of various materials on a nanotube is discussed in detail in U.S. Non-provisional utility application Ser. No. 11/703, 375, filed Feb. 7, 2006, entitled "Gas-Phase Functionalization of Carbon Nanotubes," which application is hereby incorporated herein by reference. More specifically, ALD techniques for depositing metals and metal oxides based-on metal acetamidinate vapors, including metals such as manganese, iron, cobalt, nickel, copper, silver and lanthanum, are discussed in International Publication Number WO 2004/0046417 A2, published Jun. 3, 2004, entitled "Atomic Layer Deposition using Metal Amidinates," which publication is hereby incorporated herein by reference.

Using any one or more of the aforementioned material deposition techniques for nanotubes, metal or metal-coated (e.g., silver or silver-coated aluminum oxide) nanostructures 406 may be formed along the nanoscale wire 412 at predetermined (e.g., controlled) locations via an "ice lithography" patterning technique based on condensed vapors. Some examples of such patterning techniques are discussed in detail in International Publication Number WO 2007/044035 A2, published Apr. 19, 2007, entitled "Patterning by Energetically-stimulated Local Removal of Solid-condensed-gas Layers and Solid State Chemical Reactions Produced with Such Layers," which publication is hereby incorporated by reference herein. In "ice lithography," a vapor (e.g., water vapor) may be condensed to form a solid condensate layer on a surface of the nanotube; essentially, the nanotube is coated with ice. Subsequently, one or more selected regions of the condensate layer (e.g., where one or more nanostructures 406 are desired) may be removed in a highly localized manner by directing a beam of energy (e.g., an electron beam) at the selected region(s) to melt the solid condensate and expose the nanotube. Once the solid condensate is removed from one or more selected regions, any one or more of the various material deposition techniques discussed above may be employed to deposit material to form the nanostructure(s). Once one or more nanostructures are formed on the nanotube, the remaining condensate can then be removed from other regions of the nanotube (e.g., the ice may be allowed to sublime).

In one exemplary implementation, one or more silver nanostructures may be formed at predetermined selected regions on the nanoscale wire 412 via ice lithography and ALD, in which gas-phase functionalization is employed to facilitate ALD based on silver acetamidinate vapors. In another exemplary implementation, the nanostructures may be formed by first depositing a dielectric metal oxide "core" (e.g., aluminum oxide), followed by an outer metallic "shell" (e.g., silver). In one aspect discussed further below, varying the thickness of such a metal shell portion of a nanostructure having a dielectric core provides for tunability of resonance conditions for surface-plasmon enhanced optical fields employed in the electro-optical trapping apparatus. In yet another aspect, the actual shape of the nanostructures may be determined at least in part on the material forming the nanostructure; for example, some materials when deposited may tend to form a substantially spherical shape, while other materials when deposited may tend to form a substantially cylindrical or other three-dimensional shape.

With respect to the theory of operation of the two-nanostructure/single potential well electro-optical atomic trapping apparatus 400 shown in FIGS. 9 and 10, a trapping device with spherical silver nanostructures 406 (nanospheres) having a diameter of 90 nanometers and separated by 2 nanometers, with an applied voltage $V_{NT}$ across the nanoscale wire 412, is considered for purposes of illustrating the salient concepts. The potential for an atom near the nanospheres is approximately a combination of an optical dipole potential due to the plasmon-enhanced laser field $U_L$, the DC Stark shift $U_{DC}$ and the van der Waals energy of the ground state $V_g$:

$$U_{trap} = U_L + U_{DC} + V_g. \quad (3)$$

The optical dipole potential is given by $$U_L = \frac{\hbar \delta}{2} \ln(1+s) \quad (4)$$

where s is the saturation parameter $$s = \frac{\Omega^2/2}{\gamma^2/4 + \delta^2}, \quad (5)$$

δ is the detuning between the laser and the atomic resonance including DC Stark shifts and van der Waals shifts, γ is the decay rate of the excited state modified by the presence of the nanostructure (discussed further below), $$\Omega = \frac{\mu E_0^L}{\hbar}$$

is the Rabi frequency describing the coupling of the laser-induced electric field of amplitude $E_0^L$ to the atomic dipole moment μ, and $U_{DC}$ and $V_g$ are derived below.

To solve for both the static and laser-induced electric fields in the near field, the quasi-static limit is considered. To handle the double-sphere geometry, contributions from each nanosphere's induced charge distribution to the electric potential Φ are expanded in spherical harmonics about each sphere center and boundary conditions are applied by translating between the two origins using addition theorems. In this manner, the electric field may be readily solved everywhere in space with external plane wave or dipole sources. In the case that the external source is an incident plane wave laser field $E^{inc}$ at frequency ω, the total electric field is $E_j^L(r) = M^{ji}(r, \omega) E_i^{inc}$, where M is the matrix describing the plasmon-induced enhancement. In the case of an external dipole source p oscillating at frequency ω at location r', the induced charge distribution in the nanostructure creates a reflected electric field $E^{ref}$ everywhere in space according to $E_j^{ref}(r) = G_{ji}(r, r'; \omega) p_i$ where G is the matrix describing the Green's function for the given geometry. In the quasi-static calculations, we use the dielectric constant of silver corresponding to the relevant excitation frequency of the source. The static field $E^{DC}$ is calculated with the spheres fixed to a particular voltage.

Figure 11:
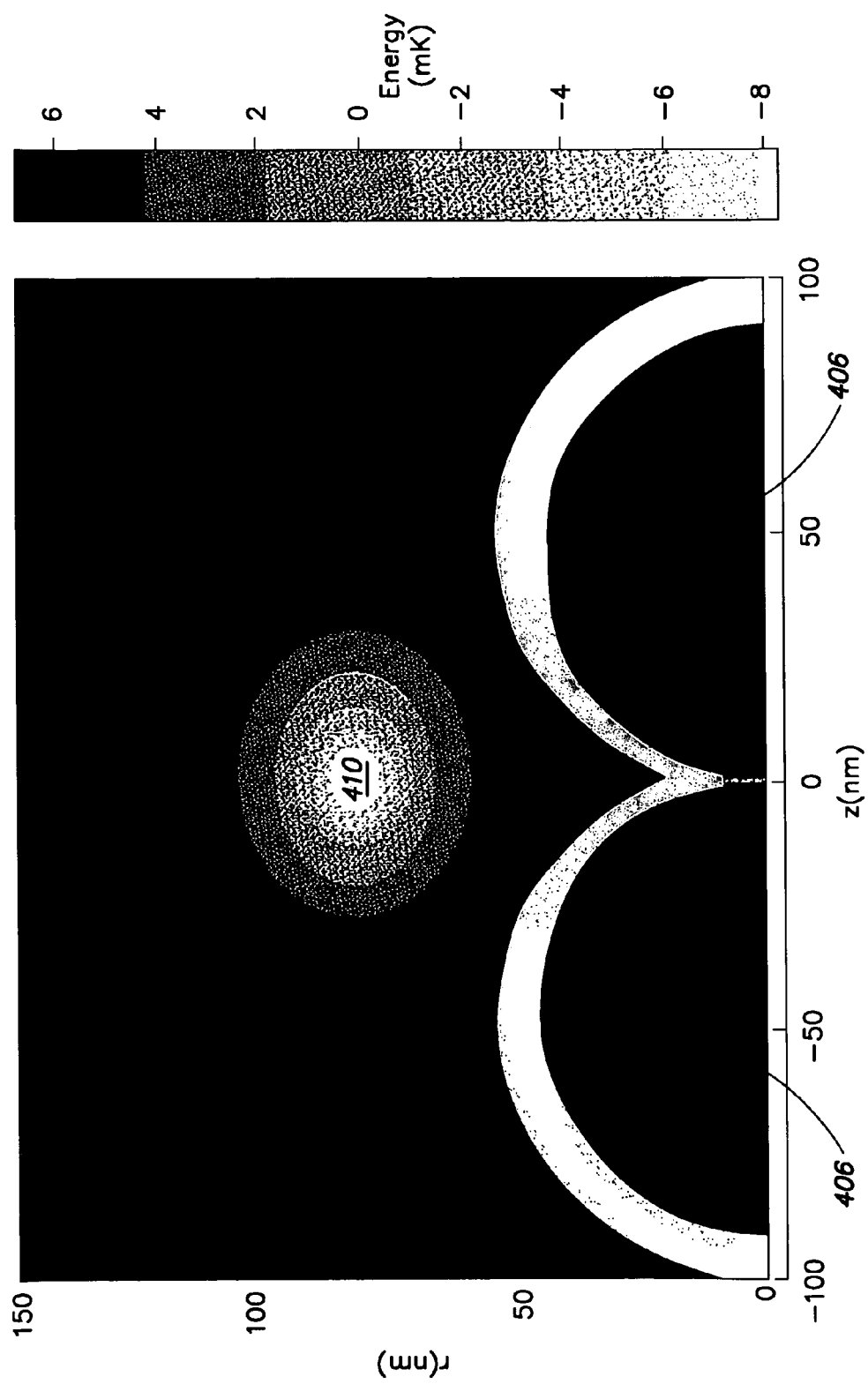
FIG. 11 is a graphical representation of a cross-section of a trapping region of the electro-optical atomic trapping apparatus of FIGS. 9 and 10, showing the trapping potential for an atom in the trapping region, according to one embodiment of the present invention.

FIG. 11 is a graphical representation of a cross-section of the trapping region 410 of the electro-optical atomic trapping apparatus of FIGS. 9 and 10, showing the trapping potential given by Eq. (3) for an atom in the trapping region, according to one exemplary implementation. For the exemplary potential depicted in FIG. 11, the optical trapping field 440 includes laser light of wavelength λ=475 nm polarized along the axis connecting two silver nanospheres 406 of diameter 90 nm and separation 2 nm, which corresponds to a plasmon resonance of 457 nm. The detuning between the laser frequency ω and the bare atomic resonance $\omega_0$ is picked to be Δ=500 Γ, where $$\Gamma = \frac{q^2 \omega_0^2}{6 \pi \varepsilon_0 m_e c^3}$$

is the decay rate of the excited state in free space. The incident laser intensity is $I_0 = 4.6 \times 10^3$ W/cm², and the voltage of the nanospheres is V=3.5 Volts ($V_{NT}$ as depicted in FIG. 10). With these parameters, the saturation parameter given in Eq. (5) is 0.24 far from the trap and 0.09 at the trap center. For contrast, the graytone scale saturates at the minimum value of $U_{trap}$ in the trapping region and has a range equal to the approximate equilibrium temperature. The low energy area near the surface of the nanospheres is the region where the attractive van der Waals energy dominates, and is not part of the trapping region. The trapping potential/region has cylindrical symmetry in the quasi-static limit.

The incident optical trapping field 440 causes Joule heating in the nanospheres according to $$Q = \frac{\omega}{2} \text{Im}(\varepsilon_{Ag}) \int (E_0^L)^2 dV.$$

For the parameters in FIG. 11, Q is estimated as Q=2 μW in each sphere. The suspended nanoscale wire 412 (e.g., carbon nanotube), due to its high thermal conductivity, conducts heat from the nanospheres 406 to a room-temperature substrate. To estimate the temperature distribution in the nanowire/nanosphere system, the heat diffusion equation is numerically solved in one dimension for a 5 μm half-length, 2 nm radius nanotube with a point heat source to represent a nanosphere on one end and the other end fixed at T=300K. The thermal conductivity of the nanotube is obtained from the relevant academic literature, and a maximum temperature of ≈640 K is found from the estimate. Since the thermal conductivity of the nanotube degrades as T increases, increasing the laser intensity beyond $4.6 \times 10^3$ W/cm² would cause the temperature to runaway (and potentially melt the nanostructure).

We consider the internal electron states of a trapped atom to be a single ground state |g> and three excited states $|e_r>, |e_\phi>$, and $|e_z>$ which are degenerate for an atom in free space. The atom is symmetric in the sense that the dipole matrix element between the ground state and any excited state $<e_i|\vec{d}|g> = \mu \vec{i}$ for i=r, φ, z where $\{\vec{i}\}_{i=r, \phi, z}$ form orthonormal basis vectors in a cylindrical coordinate system. The parameter μ is given by $$\mu = \sqrt{\frac{\hbar q^2}{2 m_e \omega_0}}$$

(the value for a two-level atom), q is the magnitude of the electron charge, $m_e$ is the mass of the electron, and $\omega_0$ is the resonance frequency of the atom. The static polarizability is given by $$\alpha_0 = \frac{q^2}{m_e \omega_0^2}.$$

The Hamiltonian for the atom interacting with the charged and laser-illuminated nanowire/two-nanosphere system is:

$$\hat{H} = (V_g + U_g)|g\rangle\langle g| + \sum_{i=r,\phi,z}(\hbar\omega_0 + V_e^i + U_e^i)|e_i\rangle\langle e_i| - \mu(|e_i\rangle\langle g| + |g\rangle\langle e_i|)\hat{i}\cdot E^L \quad (6)$$

where $$E^L = \frac{1}{2}E_0^L \hat{\epsilon} e^{-i\omega t} + c.c.,$$

and $E_0^L$ and $\overline{\epsilon}$ are the position-dependent magnitude and polarization vector of the laser-induced electric field, and $V_e^i$ and $U_e^i$ are the van der Waals and DC Stark shifts, respectively, of excited state $|e_i\rangle$.

$$|e_r\rangle = \epsilon_r|e_r\rangle + \epsilon_z|e_z\rangle \quad (7)$$

$$|e_{195}\rangle = \epsilon_z^*|e_r\rangle - \epsilon_r^*|e_z\rangle \quad (8)$$

$$|e_\phi\rangle = |e_\phi\rangle \quad (9)$$

Figure 12:
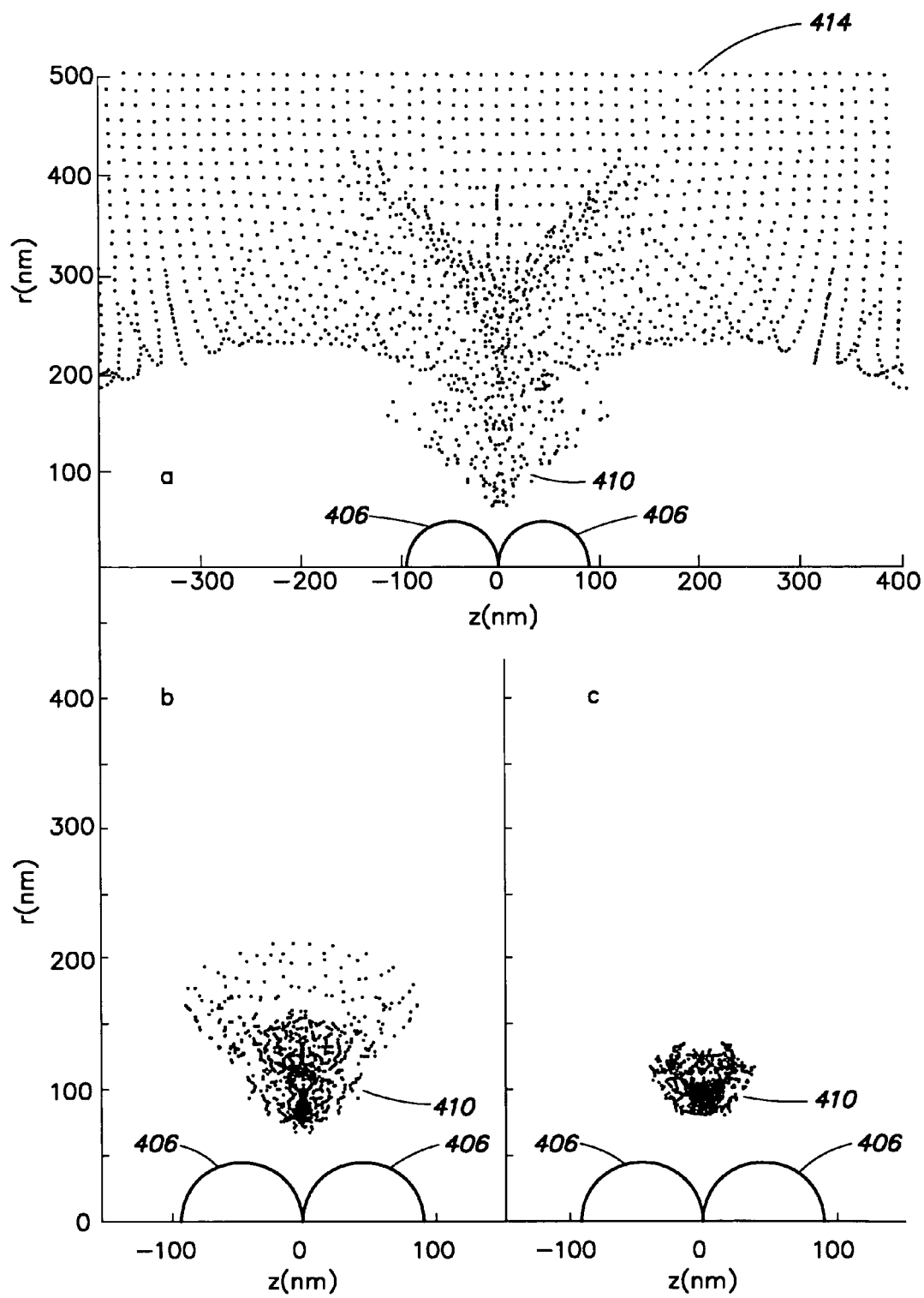
FIGS. 12*a*, 12*b*, and 12*c* graphically illustrate a simulation of atom trapping based on an atomic beam launched towards the electro-optical atomic trapping apparatus of FIGS. 9 and 10, according to one embodiment of the present invention.

In this basis, to excellent approximation, the laser couples only $|g\rangle$ and $|e\rangle$ (for all the atoms in FIG. 12, discussed below, the probability of a transition to either $|e_\perp\rangle$ or $|e_\phi\rangle$ is <3%). In the rotating frame, and with the rotating wave approximation, the Hamiltonian is:

$$\hat{H} = (V_g + U_g)|g\rangle\langle g| + (-\hbar\Delta + V_e + U_e)|e\rangle\langle e| - \frac{\hbar\Omega}{2}(|e\rangle\langle g| + |g\rangle\langle e|), \quad (10)$$

where the van der Waals and DC Stark shifts of the excited state $|e\rangle$ are given by:

$$V_e = V_e^r|\epsilon_r|^2 + V_e^z|\epsilon_z|^2 \quad (11)$$

$$U_e = U_e^r|\epsilon_r|^2 + U_e^z|\epsilon_z|^2 \quad (12)$$

From Eq. (10), the time-averaged force on an atom is given by:

$$\langle F\rangle = \frac{\hbar}{2}(\rho_{eg} + \rho_{ge})\nabla\Omega - \frac{i\hbar\Omega}{2}(\rho_{eg} - \rho_{ge})\nabla\phi - \rho_{gg}\nabla(V_g + U_g) - \rho_{ee}\nabla(V_e + U_e) \quad (13)$$

where ρ is the density matrix for a two-level atom and φ is the phase of the laser field. Far-off resonance, the second term of Eq. (13) can be ignored, which corresponds to radiation pressure, and only the terms which correspond to the gradient force and level shifts can be considered. The Optical Bloch Equations (OBEs) for an atom in steady-state moving at velocity v are $$(v\cdot\nabla)\rho = \frac{1}{i\hbar}[\hat{H},\rho]. \quad (14)$$

Eq. (14) is solved by expanding ρ up to first-order in velocity. For a resting atom, Eqs. (10,13, and 14) yield:

$$\langle F\rangle = -\frac{\hbar\delta\Omega\nabla\Omega}{2(1+s)(\gamma^2/4+\delta^2)} + \frac{\hbar s\nabla\delta}{2(1+s)} - \nabla(V_g + U_g) \quad (15)$$

where $$\delta = \Delta - (V_e + U_e - V_g - U_g)/\hbar. \quad (16)$$

If we are in a regime where we are both far-detuned ($\delta \gg \gamma$) and where the detuning is relatively constant compared to the Rabi frequency $$\left(\left|\frac{\nabla\delta}{\delta}\right| \ll \frac{|\nabla\Omega|}{\Omega}\right),$$

Eq. (15) is derivable from the potential in Eq. (3), which is plotted in FIG. 11.

The DC Stark shift of the ground state has contributions from coupling of the ground state to all excited states, and thus depends only on the magnitude of $E^{DC}$:

$$U_g = -\frac{1}{2}\alpha_0|E^{DC}|^2, \quad (17)$$

whereas each of the excited states $|e_i\rangle$ couples only to the ground state, and the corresponding DC Stark shift is $$U_e^i = \frac{1}{2}\alpha_0|E_i^{DC}|^2. \quad (18)$$

In realistic cases for multilevel atoms, static polarizabilities of excited states may be of the same sign and greater than those of ground states. However, since we pick $\Delta \gg U_e^i$ in the trap region, our scheme does not depend on the specific form of $U_e^i$.

One of the most interesting features of a nanoscale trap is the interaction between the atom and nanostructure that exists even in the absence of external source fields. There will be a position-dependent van der Waals or Casimir-Polder shift as well as a modification of the excited state lifetime.

The van der Waals energies $V_g$ are $V_e$ arise from coupling of atomic states to the modified (due to the nanostructure) electromagnetic vacuum modes. In the near field, the ground state energy shift $V_g$ of an atom in front of a perfect conducting plane is known to be the same as the London energy of a fluctuating dipole moment interacting with its image dipole. Although the energy shift is modified if the material has a frequency-dependent dielectric function, it has been shown that the shift in front of a perfect conductor is always at least as great in magnitude as in front of a realistic metal. Therefore, in the current case, we can approximate the van der Waals shift of the ground state as the energy shift of a fluctuating dipole in front of two conducting spheres:

$$V_g \approx -\frac{1}{2}|\mu|^2 \sum_{i=r,\phi,z} G_{ii}^{stat} \quad (19)$$

where $G_{ii}^{stat} = G_{ii}(r,r;0)$.

Excited state van der Waals shifts contain two contributions. One is the opposite of the corresponding contribution to the ground state van der Waals shift, and the other is a "classical" contribution corresponding to the resonant frequency modification of a Lorentz oscillator interacting with the reflected field from the nanostructure. This classical contribution is twice the London energy. Keeping our previous approximation for the ground state van der Waals shift in Eq. (19), $$V_e^i \approx \frac{1}{2}|\mu|^2 (G_{ii}^{stat} - 2\text{Re}(G_{ii}^{res})) \quad (20)$$

where $G_{ii}^{res} = G_{ii}(r,r;\omega_0)$.

A further effect of the coupling to the electromagnetic vacuum modes is the modification of the decay rate of an excited state due to the proximity of the atom to the nanostructures. The decay rate calculated from the damping of a classical, oscillating dipole interacting with the electric field reflected from the nanostructure agrees with a full quantum treatment. However, when the reflected field is calculated in the quasi-static limit, this damping only yields the nonradiative decay rate corresponding to ohmic loss in the nanostructure according to:

$$\frac{\gamma_{nr}}{\Gamma} = \frac{6\pi\varepsilon_0}{k^3} \sum_{ij} \text{Im}(\varepsilon_i \varepsilon_j^* G_{ji}^{res}) \quad (21)$$

The radiative decay γ, can then be added separately. By invoking energy conservation we calculate γ by calculating the energy radiated into the far field. To relate the dipole far field emission to the local field enhancement of incident plane wave we appeal to the reciprocity theorem and find:

$$\frac{\gamma_r}{\Gamma} = \sum_{ijk} \varepsilon_i \varepsilon_j^* M_{ik} M_{jk}^* \quad (22)$$

We can obtain γ everywhere in space through Eqs. (21) and (22), and $\gamma = \gamma_r + \gamma_{nr}$.

In order for the atom to be stably trapped, the equilibrium temperature characterizing its center-of-mass motion must be less than the barrier for an atom to escape the trap. When excited with a strong laser-induced electric field blue-detuned from its resonance, the atom loses kinetic energy because its fluorescence spectrum is asymmetric. In a strong field limit where $$\Omega^2, \delta^2, \frac{\Omega^4}{\delta^2}, \frac{\Omega^6}{\delta^4} \gg \gamma,$$

the damping of the center-of-mass motion due to the gradient force is $$F \approx -\frac{2\hbar s^2}{\gamma(1+s)^3}((\nabla\Omega)\cdot v)\nabla\Omega \quad (23)$$

The dependence of the damping on the gradient of the Rabi frequency opens up the possibility to achieve extraordinary damping rates by using highly localized fields, such as in the present case. However, the laser-induced electric field also heats the atom through the random action of spontaneous emission which can be characterized by a coefficient of momentum diffusion such that $$\frac{d(\Delta P^2)}{dt} = 2D.$$

In the strong-field limit, $$D \approx \frac{\hbar^2 \delta s^3}{2\gamma(1+s)^3} |\nabla\Omega|^2 \quad (24)$$

The heating in Eq. (24) scales faster than the damping coefficient in Eq. (23) with increasing laser power. Therefore, the equilibrium temperature of the atomic motion, given by the ratio of the heating in Eq. (24) to the dissipated power in Eq. (23) averaged over an isotropic velocity distribution, is $$k_B T = \frac{\hbar\Omega^2}{4\delta} \quad (25)$$

Unlike the optical dipole potential in Eq. (4), the atom's equilibrium temperature always scales linearly with the saturation parameter. In fact, it turns out that the equilibrium temperature can never be lower then the magnitude of $U_L$ ($T_{eq} \geq |U_L|$). Therefore, by adding the electrostatic field we help stabilize the trap by lowering the potential in one region of space without changing the equilibrium temperature. For the parameters in FIG. 11, $$\frac{\hbar\Omega^2}{4\delta}$$

at the location of minimum potential energy is approximately 16 mK, whereas the barrier an atom must overcome to escape the trap is approximately 49 mK.

In order to be viable, the electro-optical trapping apparatus must not only be stable, but it must also be loadable. To verify this, we solve for the atomic motion numerically using our solutions for $E^L$, $E^{DC}$, Eq. (13), and the OBEs. We use a linear damping force up to a critical velocity in each direction of $v_i = \gamma\Omega/d_i\Omega$, above which we assume no damping, and we assume an atomic mass of 23 amu. FIGS. 12a, 12b and 12c display results of a launch of atoms with velocity of 1 m/s from $r_0 = 500$ nm, at various horizontal positions z with respect to the nanospheres 406. In order to surmount the barrier created by the incident laser, the initial velocity of the atoms far from the nanostructure would be 5.5 m/s. The position of the atoms are plotted every 15 ns for various time windows. In FIG. 12a, the time window is t=0 to 600 ns, in FIG. 12b the time window is t=3 to 3.6 μs, and in FIG. 12c the time window is t=6 to 6.6 μs. The shading of the atoms refers to their approximate total energy, $$E = \frac{1}{2}mv^2 + U_{trap}$$

as given by Eq. (3). In particular, the atom color is gray when E is greater than 16.2 mK, and the atom color is black when E is less than 16.2 mK, which corresponds to the energy halfway between the minimum $U_{trap}$ and escape. It is estimated that toms launched from $|z_0| \leq 225$ nm are ultimately trapped. To estimate the height of the cross-section we can add a centrifugal barrier to the potential plotted in FIG. 11. We estimate that atoms above or below the plane by 50 nm n can still be stably trapped, resulting in a cross-section of approximately $4 \times 10^{-10}$ cm$^2$. This size cross-section makes loading the trapping apparatus feasible from a launched magneto-optical trap (MOT).

Electro-optical nanoscale trapping apparatus as described above can be designed with parameters other than those used in FIG. 11, according to various embodiments of the present invention. To design such a trap, the first consideration is to approximately match the plasmon resonance of the nanostructures 406 with the atomic resonance. This can perhaps best be done through the use of nanoshells, which exhibit resonances throughout the visible and infrared. The maximum incident laser intensity is set by Joule heating of the nanostructure. The remaining trap parameters $\Delta$ and V can be simultaneously tuned to approximately preserve the trap shape, but the saturation parameter $$S \approx \frac{\Omega^2}{2\delta^2}$$

will vary as a result. If $\Delta$ is too large, the laser barrier at the nanostructure surface suffers. Also the condition $$\left(\frac{\delta}{\gamma}\right)^2 s^2 > \frac{1}{2}$$

must be met in order for the standing wave to cool and not heat the atoms. On the other hand, if $\Delta$ is too close to resonance then the DC Stark shifts can modify $\delta$ and ruin the trap barrier. Also $U_L$ levels out when s>1 due to population of the excited state.

In view of the foregoing analysis, nanoscale electro-optical trapping methods and apparatus as discussed herein are stable against laser heating of the atoms and loadable from a launched atom beam. The enormous field gradients created by surface plasmons facilitate rapidly damping atomic motion in a compact region. Furthermore, the individual trapping sites presented here have a number of interesting features. Separately adjusting the laser detuning and nanostructure voltage allows the trapped atom's position on the nanometer scale to be changed, even to the point of splitting the single trapping site into two weakly coupled sites. Furthermore, by creating traps close to the nanostructure surface, new effects may occur, such as a modification of the atomic polarizability due to the atom's interaction with its image and a modified coupling of the atomic dipole to its environment due to its interaction with the nanostructure. Additionally, the ability to design a single nanoscale trapping site opens up the possibility for designing tailor-made optical lattices one site at a time, which could be of great use in quantum information and condensed matter studies.

Based on the general architecture and theory of operation for the single potential well electro-optical atomic trapping apparatus 400 discussed above in connection with FIGS. 9-12, it should be readily appreciated that a multiple potential well trapping apparatus pursuant to these principles may be realized by employing additional (i.e., more than two) nanostructures (e.g. nanospheres, nanocylinders) along a length of a nanotube, and/or multiple nanotubes arranged in proximity, wherein each such nanotube has formed thereon multiple nanostructures to facilitate generation of electrostatic attractive fields as well as surface plasmon-enhanced optical fields. As discussed above in connection with FIGS. 9 and 10, while two nanostructures 406 are shown in the trapping apparatus 400, more than two such nanostructures may be introduced along a length of the nanoscale wire 412 at various predetermined (e.g., controlled) locations (e.g., via "ice lithography" and ALD techniques discussed above), including a periodic array of more than two nanostructures. Furthermore, in some embodiments, multiple such structures (i.e., multiple nanotubes each decorated with multiple nanostructures) may be used in combination to facilitate atom trapping.

Figure 13:
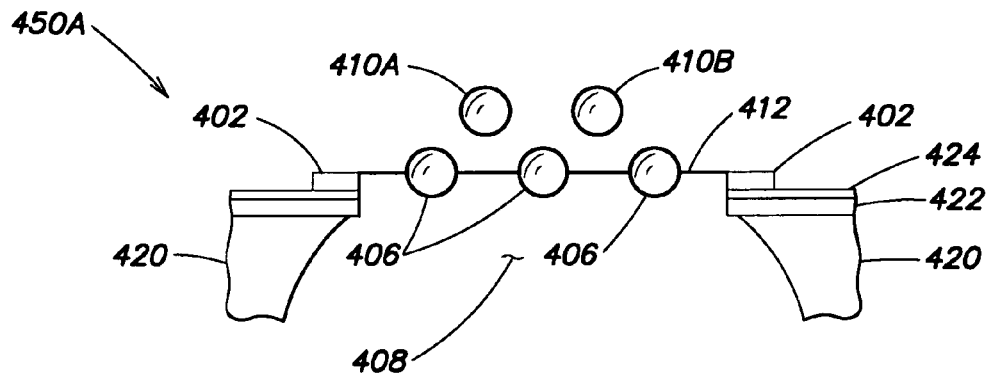
FIGS. 13 and 14 illustrate respective side views of electro-optical trapping apparatus for creating a double potential well atomic trap, according to other embodiments of the present invention.
Figure 14:
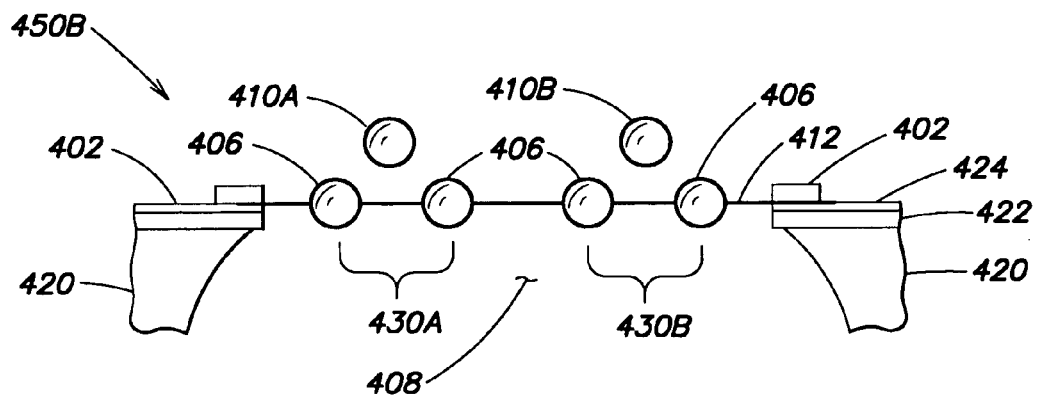

In view of the foregoing, FIGS. 13 and 14 illustrate respective side views of other embodiments of electro-optical trapping apparatus according to the present invention, for creating a double potential well atomic trap. In one aspect, the apparatus shown in FIGS. 13 and 14 are suitable for use in a system similar to the system 500 shown in FIG. 2 for storage, transfer and/or control of optical information via two phase-coherent objects. In particular, FIG. 13 illustrates a double potential well electro-optical atom trapping apparatus 450A, based on the general architecture shown in FIGS. 9 and 10, however employing three nanostructures (e.g., nanospheres) 406 disposed along a length of the nanoscale wire 412 instead of two nanostructures. In this embodiment, the center nanostructure of the three nanostructures contributes to the generation of both a first trapping region 410A and a second trapping region 410B proximate to the collection of nanostructures. In FIG. 14, a double potential well electro-optical trapping apparatus 450B employs a first pair 430A of nanostructures 406 to generate a first trapping region 410A, and a second pair 430 of nanostructures 406 to generate a second trapping region 410B.

Figure 15:
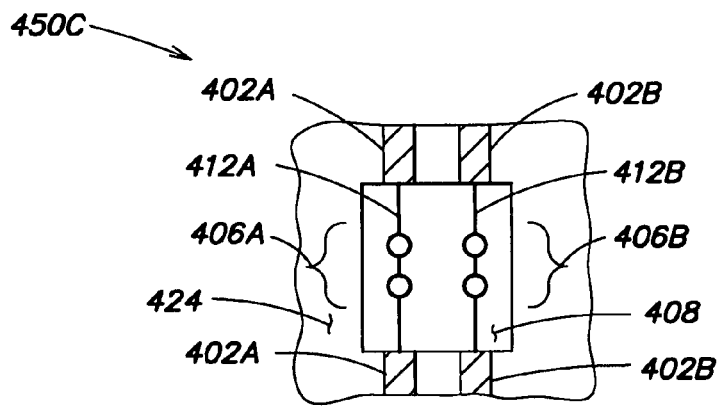
FIG. 15 illustrates a top view of a portion of an electro-optical trapping apparatus for creating a multiple potential well atomic trap, according to one embodiment of the present invention.

FIG. 15 illustrates a top view of a portion of an electro-optical trapping apparatus 450C for creating a multiple potential well atomic trap, according to yet another embodiment of the present invention. In the embodiment of FIG. 15, a first nanoscale wire 412A and a second nanoscale wire 412B are synthesized to form respective bridges across the gap 408. One or more first nanostructures 406A are formed on the first nanoscale wire 412A, and one or more second nanostructures 406B are formed on the second nanoscale wire 412B. In FIG. 15, the first nanoscale wire 412A is connected to a first pair of electrical contacts 402A, and the second nanoscale wire 412B is connected to a second pair of electrical contacts 402B; however, in other embodiments, it should be appreciated that both nanoscale wires 412A and 412B may be electrically connected to a same pair of electrical contacts. In other respects, the remaining structure of the electro-optical trapping apparatus 450C shown in FIG. 15 may be substantially similar to the apparatus 450A and 450B shown in cross-section in FIGS. 13 and 14, respectively. While FIG. 15 shows two nanoscale wires each having two nanostructures formed thereon, it should be appreciated that the present invention is not limited in these respects, as different numbers of nanoscale wires, and different numbers of nanostructures formed on a given nanoscale wire, may be employed in other embodiments.

From FIGS. 13, 14, and 15, it should be appreciated that a wide variety of multiple potential well atomic trap configurations may be realized based on the concepts disclosed herein. Various aspects and parameters associated with the general configurations illustrated in FIGS. 13-15 may be tailored to provide a rich variety of possible trapping geometries. Examples of such aspects and parameters include, but are not limited to, a size of the nanostructures, the material of the nanostructures (e.g., metal, metal-coated dielectric), a spacing between respective nanostructures, a spacing between nanostructure pairs (e.g., see FIG. 14), a number of nanostructures formed on a given nanoscale wire, and a number and spacing between multiple nanoscale wires if multiple nanoscale wires are employed (e.g., see FIG. 15). In other aspects, it should be appreciated that with each of the configurations illustrated in FIGS. 13-15, while not shown in these figures, a single atom source and single optical source to provide an appropriate optical trapping field (e.g., the atom stream 414 and the optical beam 440 in FIG. 9) may be employed in multiple potential well trapping apparatus similar to those illustrated.

In yet another embodiment, the source of atoms (e.g., the atom stream 414 shown in FIG. 9) for an electro-optical trapping apparatus according to the present disclosure, and similarly a source of one or more phase-coherent objects for information storage, transfer and/or control, may be provided by electrolytic methods and apparatus for releasing alkali metals such as sodium, potassium, rubidium, and cesium. Examples of such methods and apparatus are discussed in detail, for example, in "Electrolytic fabrication of atomic clock cells," F. Gong et al., Review of Scientific Instruments 77, 076101 (2006) (hereafter "Gong et al."), which is hereby incorporated herein by reference. Such methods and apparatus are based on the premise that relatively large amounts of alkali metal can be released by passing an electrolytic current through hot glass.

Figure 16:
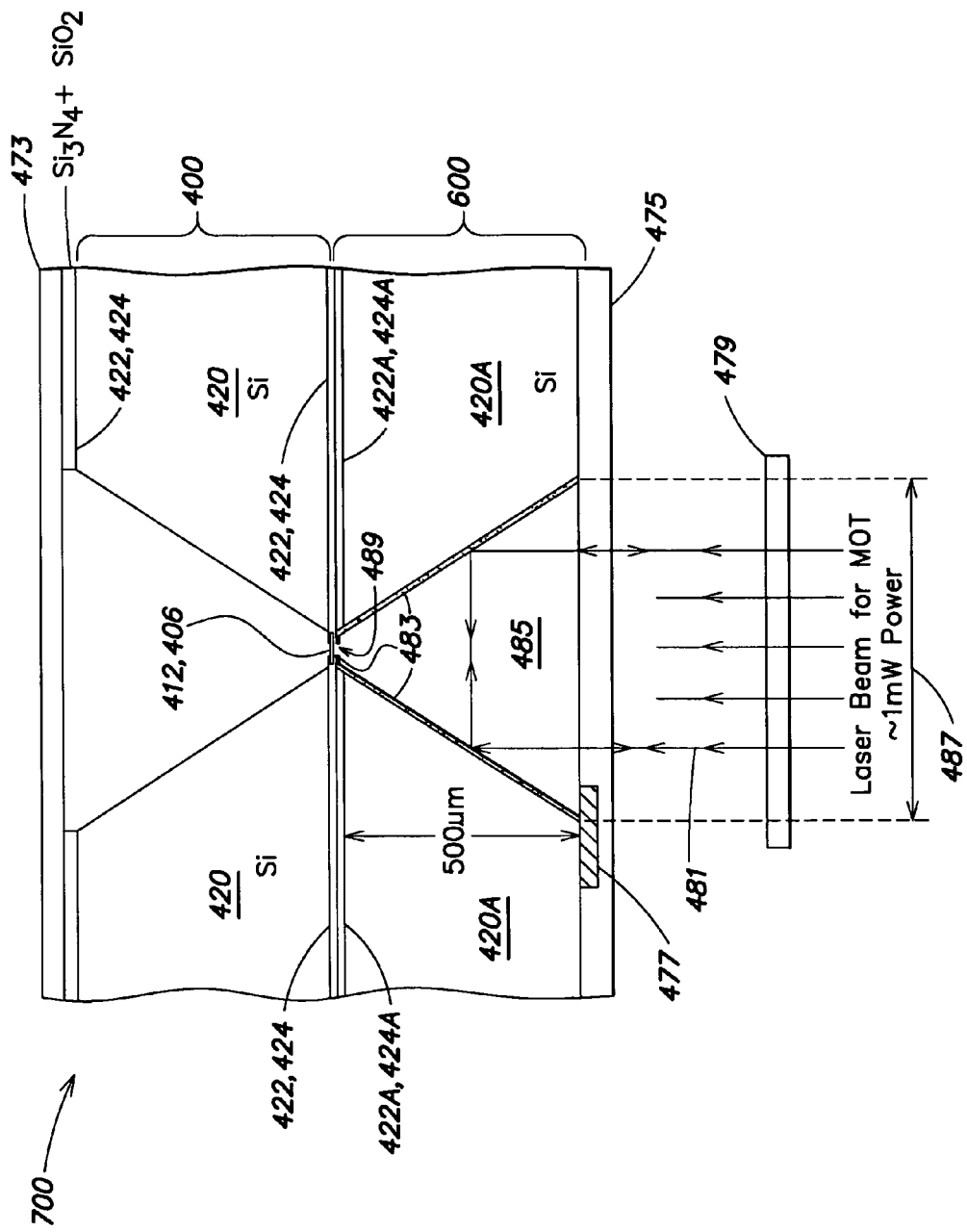
FIG. 16 illustrates a cross-sectional view of an electro-optical trapping apparatus that includes an electrolytic alkali atom source and a pyramidal magneto-optic trap for loading the electro-optical trapping apparatus with the alkali atoms, according to one embodiment of the present invention.

FIG. 16 illustrates a cross-sectional side view of an electro-optical trapping apparatus 700 according to yet another embodiment of the present invention, which essentially is a combination of an electro-optical trapping apparatus similar to those shown in FIGS. 9-15 integrated with an electrolytic atom source and a pyramidal magneto-optic trap to provide an atom stream 414 for loading the electro-optical trapping apparatus. For purposes of illustration, the apparatus 700 of FIG. 16 is discussed using the electro-optical trapping apparatus 400 of FIGS. 9 and 10 as an example; however, it should be appreciated that electro-optical trapping apparatus similar to those shown in FIGS. 13-15, or other configurations, may be employed in an apparatus similar to that shown in FIG. 16.

The apparatus 700 shown in FIG. 16 is based essentially on a mirror-like architecture, in which the apparatus 400 shown in cross-section in FIG. 10 is flipped by 180 degrees (e.g., upside down with respect to FIG. 10) and forms a "top portion" of the apparatus 700. As such, the nanoscale wire 412 and nanostructures 406 are indicated in a middle area of the apparatus 700, with other elements of the apparatus 400 (e.g., the silicon substrate 420 and dielectric layers 422 and 424) indicated accordingly in the top portion. In FIG. 16, the bottom portion of the apparatus 700 is constituted by a pyramidal magneto-optical trap (MOT) 600 and an electrolytic alkali atom source 477. A portion of the magneto-optical trap 600 is formed by an etched substrate 420A (e.g., silicon) to form a pyramidal cavity 485 having a "base width" 487 of approximately 700 micrometers, and essentially mirrors the general configuration of the apparatus 400 in the upper portion. The MOT also may include dielectric layers 422A and 424A on a surface proximate to the apparatus 400 in the top portion. Examples of MOT operation, design elements, and fabrication techniques suitable for purposes of this embodiment are provided in: 1) J. Opt. Soc. of America B, Vol. 20, 1161 (2003); 2) Appl. Phys. Lett., Vol. 88, 071116 (2006); and 3) Optics Letters, Vol. 21, 1177 (1996), each of which publications is incorporated herein by reference. The electrolytic atom source 477 is formed in a glass substrate 475 (e.g., pursuant to the techniques described in Gong et al.) which in turn forms a bottom cover for the apparatus 700. An optional glass substrate 473 also may be placed on top of the apparatus 400 in the top portion to provide a top cover for the apparatus 700.

As illustrated in FIG. 16, the exposed surfaces of the substrate 420A of the MOT 600 (the "interior" surfaces resulting from etching) include a gold or silver coat 483 to provide a reflective surface within the cavity 485 of the MOT. An optical source (laser beam) 481 for the MOT (e.g., having a power of approximately 1 mW) is passed through a quarter-wave plate 479 ($\lambda/4$) and directed into the cavity 485. Atoms generated by the electrolytic atom source 477 escape the pyramidal MOT 600 through a small escape hole 489 at the apex of the pyramidal cavity 485 and are thusly directed to one or more trapping regions proximate to the nanoscale wire 412 and the nanostructure 406. The escaped atoms form a continuous wave beam or a pulsed beam of atoms (e.g., similar to the atom stream 414 shown in FIG. 9) that is slowed and cooled to an average drift velocity of a few meters per second and cooled (in the moving rest system—moving with this average drift velocity) to rms velocities in the 10 cm/sec range so as to optimize loading rates and minimize "kick out" of already trapped atoms by high energy atoms. In one aspect, differential pumping can also be applied in the apparatus 700 (e.g., pumping with getter material on both sides of the escape hole 489), such that the pyramidal cavity 485 in the bottom portion constitutes a "dirty" side of the apparatus 700, and the cavity formed in the apparatus 400 in the top portion constitutes a "clean" side of the apparatus (i.e., where atom trapping and optical processing takes place).

Figure 17:
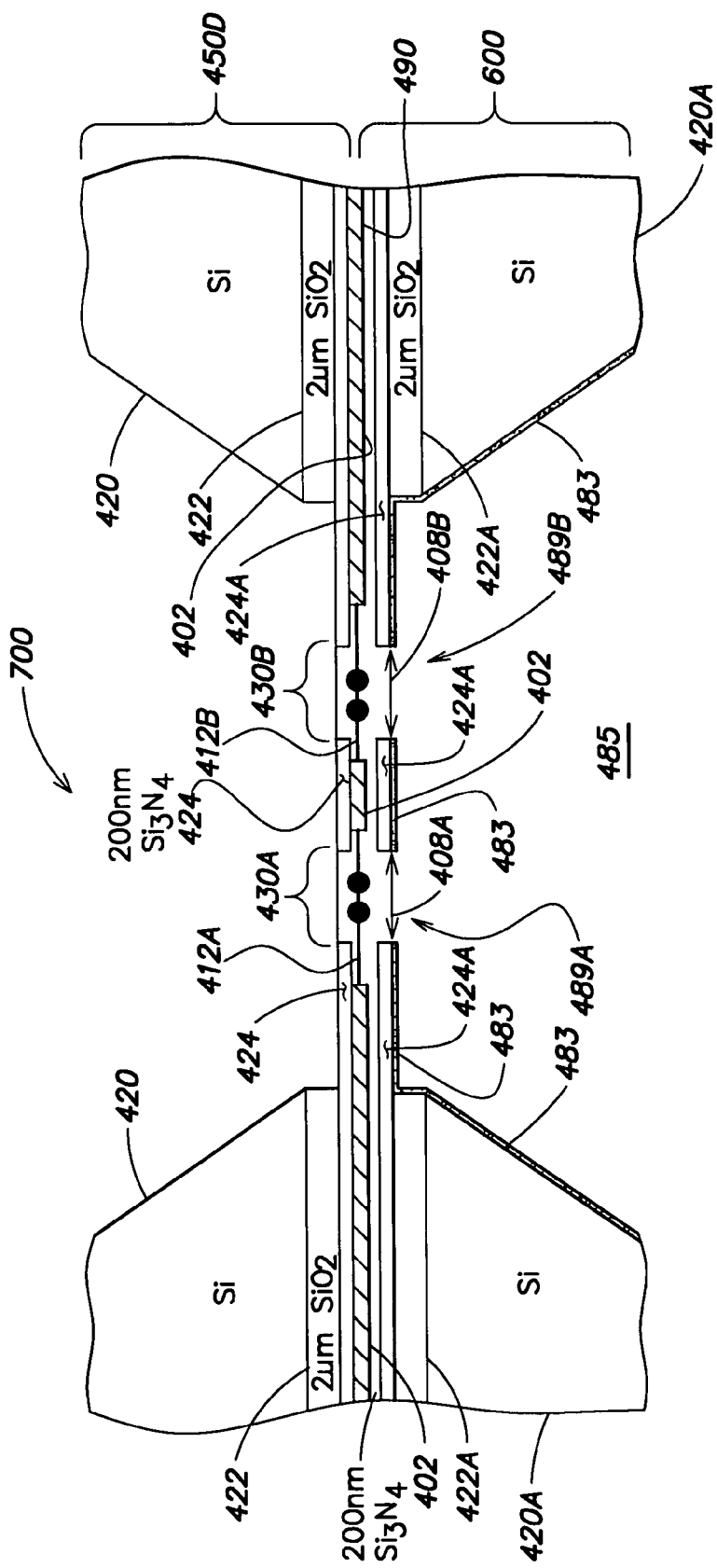
FIG. 17 is an expanded view of a middle portion of an electro-optical trapping apparatus similar to that shown in FIG. 16, according to one embodiment of the present invention.

FIG. 17 is an expanded view of a middle portion of an electro-optical trapping apparatus similar to that shown in FIG. 16, according to yet another embodiment of the present invention. For purposes of illustration in FIG. 17, the top portion of the apparatus 700 includes a double potential well electro-optical trapping apparatus 450D that in some respects is similar to the apparatus 450A, 450B and 450C shown in FIGS. 13, 14 and 15, respectively. More specifically, the apparatus 450D shown in the expanded view of FIG. 17 includes a first nanoscale wire 412A having formed thereon a first nanostructure pair 430A, and a second nanoscale wire 412B having formed thereon a second nanostructure pair 430B. Unlike the multiple nanoscale wire configuration shown in FIG. 15, however, the respective nanoscale wires in the apparatus 450D shown in FIG. 17 are disposed essentially in a serial rather than a parallel configuration on a suspended silicon nitride membrane having two apertures therein to form gaps 408A and 408B, which are respectively bridged by the first and second nanoscale wires. Similarly, the pyramidal MOT 600 forming the lower portion of the apparatus 700 includes two escape holes 489A and 489B formed in a suspended silicon nitride membrane 424A, which holes are aligned with the respective gaps 408A and 408B traversed by the nanoscale wires. In this manner, atoms generated by the electrolytic atom source may be directed by the pyramidal MOT to two separate trapping regions, one proximate to the first nanostructure pair 430A and another proximate to the second nanostructure pair 430B. FIG. 17 also indicates that the metal coating 483 for the pyramidal cavity 485 covers a surface of the suspended silicon nitride membrane 424A facing the interior of the cavity 485, as well as surfaces of the substrate 420A and dielectric layer 442A facing the interior of the cavity 485. In various aspects, the top and bottom portions of the apparatus 700 shown in FIG. 17 may be bonded at an interface 490, for example, via van der Waal forces or anodic (electrolytic) bonding techniques (e.g., as reported in Gong et al.).

In view of the various methods, apparatus and systems discussed above in connection with FIGS. 1-17, and the various concepts underlying these methods, apparatus and systems, yet another embodiment of the present invention is directed to an optical buffer apparatus. As generally appreciated in the relevant arts, an optical buffer refers to a device that is capable of storing optical information (e.g., information encoded on the phase and/or amplitude of an optical pulse, data packets in the optical domain, etc.) for some finite amount of time under the control of an optical or electrical control signal, after which the optical information is regenerated and provided as an output of the optical buffer. Optical buffering is a major obstacle facing optical packet switching for future generations of optical communication networks. Presently, perhaps the most basic conventional technique for implementing an optical buffer includes a fiber delay, in which an optical signal is routed into a spool of optical fiber (which in some instances may be as long as several kilometers). One drawback of this type of implementation is that the spools are physically large and difficult to integrate into a commercial optical router, switch or data center. Another drawback is that the delay realized by such fiber-based buffers is generally fixed.

In contrast to fiber-based implementations, an optical buffer according to one embodiment of the present invention exploits the slow-light-mediated matter wave dynamics discussed above in connection with FIGS. 1 through 8 to provide storage and revival of optical information, in some instances with variable delay times, with extraordinary optical delay/bandwidth products on the order of approximately $10^3$ to $10^4$. Accordingly, optical buffers according to the present invention may provide buffer times suitable for conventional optical network speeds of 10 and 40 Gbit/sec (e.g., buffer times on the order of tens to hundreds of microseconds).

Figure 18:
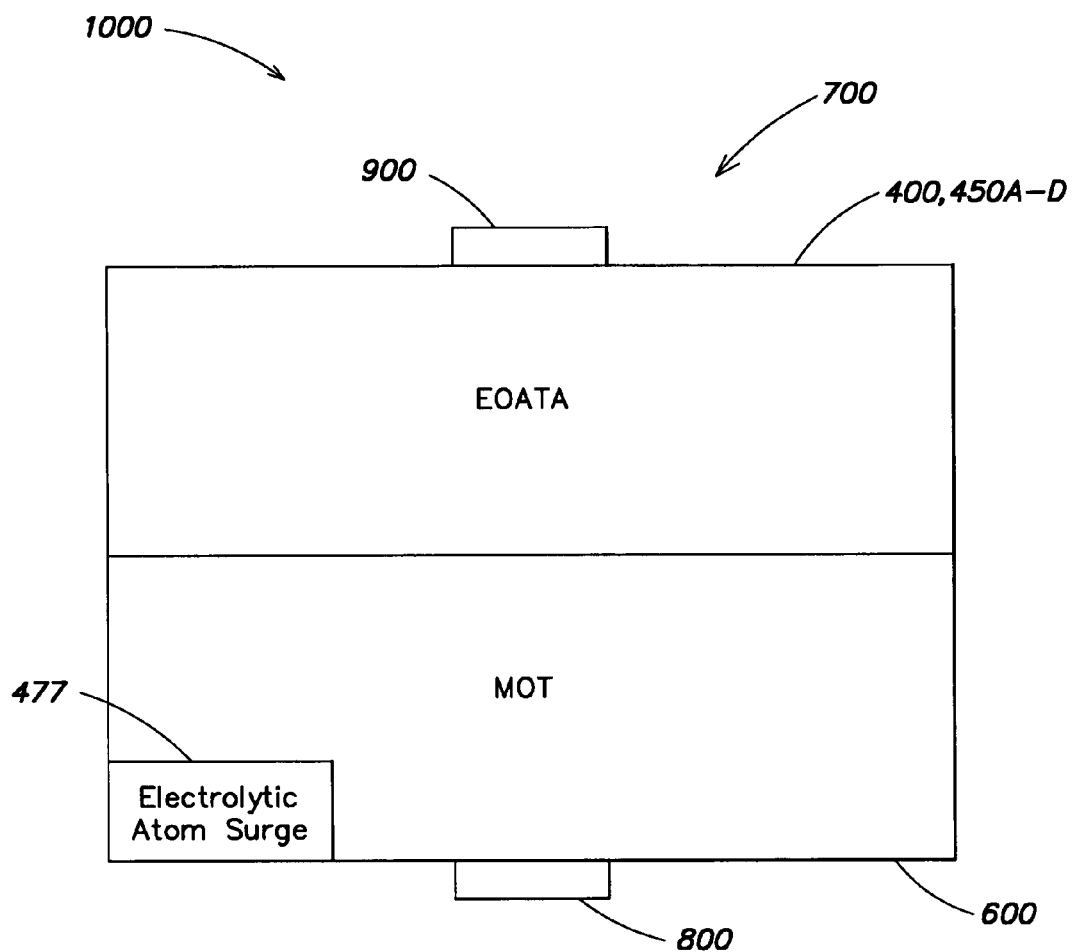
FIG. 18 provides a generalized block diagram of various elements constituting an optical buffer apparatus according to one embodiment of the present invention.

FIG. 18 provides a generalized block diagram of various elements constituting an optical buffer apparatus 1000 according to one embodiment of the present invention. Details of the respective elements shown in block form in FIG. 18 are provided in other figures discussed herein and are identified with like reference characters. In the embodiment of FIG. 18, the optical buffer 1000 comprises an integrated apparatus 700 including an electrolytic atom source 477 to generate a stream of atoms (e.g., as disclosed in Gong et al.), and an electro-optical atomic trapping apparatus (EOATA), similar to any one of those discussed above in connection with FIGS. 9-15, to form one or more trapping regions so as to trap and cool atoms of the stream to form one or more phase-coherent objects. The optical buffer apparatus further includes a first semiconductor optical source 800 that, when energized, provides a first optical field for the electro-optical atomic trapping apparatus (e.g., the optical field 440 shown in FIG. 9). The optical buffer apparatus further includes a second semiconductor optical source 900 that, when energized, provides an optical coupling field (e.g., the optical coupling field 130 shown in FIGS. 2, 4 and 8) in the at least one trapping region, to irradiate the one or more phase-coherent objects and thereby facilitate storage (and recovery) of optical information in the phase-coherent object(s). Semiconductor optical sources suitable for purposes of various embodiments of the present invention, and capable of generating continuous wave optical power on the order of 20 mW to 500 mW and at various operating wavelengths, are readily available from a variety of sources (e.g., see www.nichia.com/product/laser-main.html).

In one aspect, an optical buffer according to one embodiment of the present invention may be realized in a significantly integrated fashion based on silicon wafer-based structures and semiconductor-based optical sources. As discussed above, inventive electro-optical atomic trapping methods and apparatus according to the present disclosure, based on nanoscale structures, facilitate integrated (e.g., silicon wafer-based) realizations of inventive-methods and systems for storing, transferring, and controlling optical information via one or more phase-coherent objects. For example, in one inventive embodiment disclosed herein, an integrated silicon wafer-based optical buffer is realized based on optical information storage and recovery in one or more phase-coherent objects. In various aspects, the integrated optical buffer includes an electrolytic atom source to provide the phase-coherent object(s), and a nanoscale electro-optical atomic trapping apparatus to trap and cool the phase-coherent object(s). The integrated optical buffer also includes at least one semiconductor-based optical source as part of the electro-optical atomic trapping apparatus to provide optical trapping and damping fields, as well as at least one other semiconductor-based optical source to provide coupling fields for storage and transfer of optical information.

The operation of an optical buffer having components similar to those shown above in connection with FIG. 18 is now discussed using the example of a single potential well electro-optical trap (e.g., the trap 400 of FIGS. 9 and 10, as forming part of the integrated apparatus 700), and storage/processing of optical information via a single phase-coherent object, as discussed above in connection with FIG. 8. It should be appreciated, however, that optical buffers according to the present invention are not limited in this respect, and that optical buffers based on information transfer between two phase-coherent objects, as discussed above in connection with FIGS. 1 and 2, are contemplated by the present invention.

With reference again to FIGS. 8 and 9, for a single phase-coherent object optical buffer, an atom cloud trapped in the trapping region 410 and forming a phase-coherent object 100A is illuminated from above or below with a coupling laser field 130. The coupling laser field can be introduced into the electro-optical trapping apparatus 400 via an optical fiber. In one implementation of such an optical buffer, unlike the schematic drawing of FIG. 8, the information-carrying optical probe pulse 120 is injected into the phase-coherent object 100A from approximately the same direction as the coupling laser field 130. The probe pulse may be injected into the phase-coherent object from a second optical fiber either directly, or by matching the size of the nanoscale wire-nanostructure system and associated atom cloud size to the transverse output mode of the optical fiber. In another aspect, for smaller atom clouds, the probe pulse 120 output from the fiber may be focused onto the phase-coherent object via one or more appropriately shaped metal coated tips and/or ridges (e.g., supported by the silicon nitride membrane), with the tips and/or ridges placed in close proximity to the phase-coherent object.

The injected probe pulse 120 is slowed in the phase-coherent object and spatially compressed along its propagation direction such that it is contained in the phase-coherent object. By turning off the coupling field 130, the probe pulse 120 is stored in the phase-coherent object via creation of a superposition state with spatially varying atomic amplitude in states |1> and |2>. By selecting states |1> and |2> with different gyromagnetic ratios (i.e. different g factors), and by passing a current through the nanoscale wire (as indicated by $\Delta V_{NT}$ in FIG. 10), the |state 1> and |2> components of the atomic wavefunction separate due to their different Zeeman shifts, which in turn leads to different trap-minimum positions for the two components. This separation of the components is significant for long time storage of optical information, as it eliminates losses due to inelastic scattering between state |1> and state |2>.

In the foregoing scenario, the gentle current-induced separation between the components, rather than the photon-recoiled induced separation discussed above in connection with FIGS. 1 and 2, eliminates losses from recoil-induced elastic scattering between the two components during their separation and merging. The separation of the two components also allows for processing of one or both components during the separation period (e.g., see processor 250 in FIG. 8). For example, the processor 250 may be configured to process either component via illumination of additional metal coated tips with laser fields red and blue detuned with respect to the atomic resonance frequencies. The metal-coated tips are grown off the silicon nitride membrane and with the tips placed in close proximity to the appropriate atom trap minimum. The laser fields induce plasmon excitations in these metal-coated tips and are hence focused onto or in close proximity to one or the other of the atom components. Controlled reshaping of one or both of the atomic components is effected by controlling this illumination scheme.

After processing of the atom components, the current in the nanotube is lowered and the two wavefunction components merged. The coupling field 130 is turned on and a second optical pulse 190 is revived carrying the processed information. The coupling field used for this revival step can be propagating in the same or the opposite direction as compared to the original coupling field that was used for storing the input probe pulse in the phase-coherent object. The propagation of the second optical pulse 190 is determined from the propagation direction of the coupling field in the revival step.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method, comprising:
   A) triggering a transfer of a coherent matter wave pulse that carries information between first and second spatially separated phase-coherent objects, wherein both phase-coherent objects have a macroscopic occupation of a particular quantum state by identical bosons or identical Bardeen-Cooper-Schrieffer (BCS)-paired fermions.

2. The method of claim 1, wherein the phase-coherent objects include Bose-Einstein condensates.

3. The method of claim 2, wherein the Bose-Einstein condensates include sodium Bose-Einstein condensates.

4. The method of claim 1, wherein the phase-coherent objects include superconductors.

5. The method of claim 1, wherein the phase-coherent objects include superfluids.

6. The method of claim 1, wherein the first and second phase-coherent objects are spatially separated by a distance approximately equal to or greater than at least one dimension of one of the phase-coherent objects.

7. The method of claim 6, wherein the distance is at least approximately 100 micrometers.

8. The method of claim 1, further comprising, before A):
   storing the information in the first phase-coherent object at a storage time.

9. The method of claim 8, further comprising, after A):
   recovering the information from the second phase-coherent object at a revival time.

10. The method of claim 9, further comprising:
    controlling the revival time so as to process the information recovered from the second phase-coherent object.

11. The method of claim 1, further comprising:
    manipulating the information as it is transferred between the first and second phase-coherent objects.

12. The method of claim 1, further comprising:
    B) irradiating the first phase-coherent object with a first optical pulse, wherein the information transferred in A) relates at least in part to a phase and amplitude of the first optical pulse; and
    C) generating a second optical pulse from the second phase-coherent object based at least in part on the transferred information.

13. The method of claim 12, wherein the first optical pulse is resonant or near-resonant with a first transition between energy states of the bosons or the BCS-paired fermions of the phase-coherent objects, and wherein A) comprises:
    irradiating at least the first phase-coherent object with an optical beam resonant or near-resonant with a second transition between the energy states of the bosons or the BCS-paired fermions of the phase-coherent objects, the optical beam propagating counter to or orthogonal to a propagation direction of the first optical pulse;
    extinguishing the first optical beam at a storage time at which the first optical pulse is contained completely within the first phase-coherent object, so as to eject from the first phase-coherent object the coherent matter wave pulse carrying the information from the first optical pulse; and
    injecting the second phase-coherent object with the coherent matter wave pulse.

14. The method of claim 13, further comprising:
    controlling the storage time so as to alter the information carried by the coherent matter wave pulse.

15. The method of claim 13, wherein the bosons or the BCS-paired fermions of the phase-coherent objects have a first permissible relatively stable energy state and a second permissible relatively stable energy state, and wherein the coherent matter wave pulse represents a spatially translated wavefunction for the bosons or the BCS-paired fermions in the second permissible energy state of the first phase-coherent object.

16. The method of claim 13, wherein the optical beam is a first optical beam and wherein C) comprises:
    irradiating the second phase-coherent object with a second optical beam at a revival time at which the coherent matter wave pulse is embedded in the second phase-coherent object so as to generate the second optical pulse from the second phase-coherent object based on the transferred information carried by the coherent matter wave pulse, the second optical beam being resonant or near-resonant with the second transition between the energy states of the bosons or the BCS-paired fermions of the second phase-coherent object.

17. The method of claim 13, further comprising:
    controlling the revival time so as to control a shape of the second optical pulse.

18. The method of claim 13, further comprising:
    trapping the coherent matter wave pulse.

19. The method of claim 13, further comprising:
    manipulating the coherent matter wave pulse so as to process the transferred information.

20. The method of claim 13, further comprising:
    manipulating the coherent matter wave pulse so as to place the coherent matter wave pulse in a classical state.

21. The method of claim 13, further comprising:
    manipulating the coherent matter wave pulse so as to place the coherent matter wave pulse in a quantum state.

22. The method of claim 21, wherein the quantum state includes a squeezed state.

23. The method of claim 12, wherein the first optical pulse is in a classical state.

24. The method of claim 12, wherein the first optical pulse is in a quantum state.

25. The method of claim 24, wherein the quantum state includes a squeezed state.

26. A method of transferring optical information between first and second spatially separated atomically identical Bose-Einstein condensates, the method comprising:
    A) irradiating the first Bose-Einstein condensate with an optical beam resonant or near-resonant with a first transition between a second energy state and a third energy state of bosons of the first Bose-Einstein condensate;
    B) irradiating the first Bose-Einstein condensate with a first optical pulse resonant or near-resonant with a second transition between a first energy state and the third energy state of the bosons of the first Bose-Einstein condensate, the first optical pulse propagating counter to a propagation direction of the optical beam, wherein the transferred optical information relates at least in part to a phase and/or amplitude of the first optical pulse;
    C) extinguishing the optical beam at a storage time at which the first optical pulse is contained completely within the first Bose-Einstein condensate, so as to eject from the first Bose-Einstein condensate a coherent matter wave pulse carrying the optical information from the first optical pulse;
    D) injecting the second Bose-Einstein condensate with the coherent matter wave pulse; and
    E) irradiating the second Bose-Einstein condensate with the optical beam at a revival time at which the coherent matter wave pulse is embedded in the second Bose-Einstein condensate so as to generate a second optical pulse from the second Bose-Einstein condensate based on the optical information carried by the coherent matter wave pulse.

27. The method of claim 26, further comprising:
controlling the revival time so as to control a phase of the second optical pulse.

28. The method of claim 26, further comprising:
controlling the revival time so as to control a shape of the second optical pulse.

29. The method of claim 26, further comprising:
manipulating the coherent matter wave pulse so as to process the transferred optical information.

30. A system for transferring optical information, the system comprising:
a first phase-coherent object to receive a first optical pulse resonant or near-resonant with a first transition between a first energy state and a third energy state of bosons or Bardeen-Cooper-Schrieffer (BCS)-paired fermions of the first phase-coherent object;
a radiation source configured to generate an optical beam that irradiates at least the first phase-coherent object in a direction that is counter-propagating to or orthogonal to the first optical pulse, the optical beam being resonant or near-resonant with a second transition between a second energy state and the third energy state of bosons or BCS-paired fermions of the first phase-coherent object;
a second phase-coherent object spatially separated from the first phase-coherent object, wherein the first and second phase-coherent objects have a macroscopic occupation of a particular quantum state by identical bosons or BCS-paired fermions; and
a controller configured to control at least the radiation source to turn on and off the optical beam so as to transfer the optical information from the first phase-coherent object to the second phase-coherent object via a coherent matter wave pulse, wherein the transferred optical information relates at least in part to a phase and amplitude of the first optical pulse.

31. The system of claim 30, wherein the controller is further configured to control the radiation source to turn on and off the optical beam so as to generate from the second phase-coherent object a second optical pulse based on the optical information transferred by the coherent matter wave pulse.

32. A system for transferring optical information, the system comprising:
a first phase-coherent object to receive a first optical pulse resonant or near-resonant with a first transition between a first energy state and a third energy state of bosons or Bardeen-Cooper-Schrieffer (BCS)-paired fermions of the first phase-coherent object;
a radiation source configured to generate an optical beam that irradiates at least the first phase-coherent object in a direction that is counter-propagating to or orthogonal to the first optical pulse, the optical beam being resonant or near-resonant with a second transition between a second energy state and the third energy state of bosons or BCS-paired fermions of the first phase-coherent object;
a second phase-coherent object spatially separated from the first phase-coherent object, wherein the first and second phase-coherent objects have a macroscopic occupation of a particular quantum state by identical bosons or BCS-paired fermions;
a controller configured to control at least the radiation source to turn on and off the optical beam so as to transfer the optical information from the first phase-coherent object to the second phase-coherent object via a coherent matter wave pulse, wherein the transferred optical information relates at least in part to a phase and amplitude of the first optical pulse; and
at least one nanotube configured to facilitate support of the first and second phase-coherent objects.

33. A method of processing information via a phase-coherent object, the method comprising:
A) triggering ejection of a matter wave pulse from the phase-coherent object, the matter wave pulse carrying the information and representing a wavefunction of at least one of a first energy level and a second energy level of the phase-coherent object;
B) manipulating the matter wave pulse so as to manipulate the information carried by the matter wave pulse; and
C) injecting the phase-coherent object with the matter wave pulse.

34. The method of claim 33, wherein A) comprises:
irradiating the phase-coherent object.

35. The method of claim 33, wherein A) comprises:
placing the phase-coherent object in a magnetic field gradient.

36. The method of claim 33, wherein:
A) comprises triggering ejection of the matter wave pulse from a first portion of the phase-coherent object; and
C) comprises injecting a second portion of the phase-coherent object with the matter wave pulse.

37. The method of claim 33, wherein B) comprises:
propagating the matter wave pulse through a trajectory outside the phase-coherent object.

38. The method of claim 33, wherein B) comprises:
applying an electromagnetic field to the phase-coherent object.

39. The method of claim 33, wherein the matter wave pulse carries information, and further comprising, before A):
imprinting the phase-coherent object with the information.

40. The method of claim 39, wherein B) further comprises:
altering at least one characteristic of the matter wave pulse.

41. A system for processing information, the system comprising:
a phase-coherent object having first and second energy levels imprinted with information;
a source to cause the phase-coherent object to eject a matter wave pulse, representing a wavefunction of at least one of the first and second energy levels, that carries the information; and
a processor to alter at least one characteristic of the matter wave pulse so as to manipulate the information carried by the matter wave pulse.

42. The system of claim 41, wherein the source irradiates the phase-coherent object so as to cause the phase-coherent object with to eject the matter wave pulse.

43. The system of claim 41, wherein the source places the phase-coherent object in a magnetic field gradient so as to cause the phase-coherent object with to eject the matter wave pulse.

44. The system of claim 41, wherein the processor injects the phase-coherent object with the matter wave pulse.

45. The system of claim 41, wherein the at least one characteristic of the matter wave pulse altered by the processor is a delay experienced by the matter wave pulse.

46. The system of claim 41, further comprising:
a controller to control ejection of the matter wave pulse from the phase-coherent object by the radiation source.

* * * * *